United States Patent [19]
Lee et al.

[11] Patent Number: 5,355,020
[45] Date of Patent: Oct. 11, 1994

[54] SEMICONDUCTOR DEVICE HAVING A MULTI-LAYER METAL CONTACT

[75] Inventors: Sang-in Lee; Jeong-in Hong, both of Suwon; Jong-ho Park, Koyang, all of Rep. of Korea

[73] Assignee: Samsung Electronics Co., Ltd., Kyungki-do, Rep. of Korea

[21] Appl. No.: 910,894

[22] Filed: Jul. 8, 1992

[30] Foreign Application Priority Data

Jul. 8, 1991 [KR] Rep. of Korea ............... 91-11543

[51] Int. Cl.$^5$ ............................................. H01L 23/48
[52] U.S. Cl. .................................. 257/741; 257/765; 257/767; 257/771
[58] Field of Search ............... 257/771, 741, 751, 765, 257/767, 740

[56] References Cited

U.S. PATENT DOCUMENTS

| | | | |
|---|---|---|---|
| 4,151,545 | 4/1979 | Schnepf et al. | 257/765 |
| 4,520,554 | 6/1985 | Fisher | 257/765 |
| 4,714,951 | 12/1987 | Baudrant et al. | 257/771 |
| 4,910,580 | 3/1990 | Kuecher et al. | |
| 4,912,543 | 3/1990 | Neppl et al. | 257/771 |
| 4,987,562 | 1/1991 | Watanabe | 257/751 |
| 4,997,518 | 3/1991 | Madokoro | 257/765 |

FOREIGN PATENT DOCUMENTS

| | | |
|---|---|---|
| 0132720 | 7/1984 | European Pat. Off. . |
| 0244995 | 11/1987 | European Pat. Off. . |
| 0361572 | 9/1989 | European Pat. Off. . |
| 9208365 | 7/1992 | France . |
| 3016130 | 1/1991 | Japan . |
| 2068640 | 8/1981 | United Kingdom . |
| 2075255 | 11/1981 | United Kingdom . |

Primary Examiner—William Mintel
Assistant Examiner—Roy Potter
Attorney, Agent, or Firm—Robert A. Westerlund; Stephen R. Whitt; Charles R. Donohoe

[57] ABSTRACT

A wiring layer of a semiconductor device having a novel contact structure is disclosed. The semiconductor device includes a semiconductor substrate, an insulating layer having an opening (contact hole or via) and a first conductive layer formed on the insulating layer which completely fills the opening. The first conductive layer does not produce any Si precipitates in a subsequent heat-treating step for filling the opening with the first conductive layer material. The semiconductor device may further include a second conductive layer having a planarized surface on the first conductive layer. This improves subsequent photolithography. An anti-reflective layer may be formed on the second conductive layer for preventing an unwanted reflection during a photo lithography process. The semiconductor device preferably includes a diffusion barrier layer under the first conductive layer and on the semiconductor substrate, on the insulating layer, and on the inner surface of the opening which prevents a reaction between the first conductive layer and the semiconductor substrate or the insulating layer. A method for forming the wiring layer is also disclosed. Providing a semiconductor device with the wiring layer reduces the leakage current by preventing an Al spiking. Since the first conductive layer undergoes a heat-treatment step at a temperature below the melting point, while flowing into the opening and completely filling it with the first conductive layer material, no void is formed in the opening. Good semiconductor device reliability is ensured in spite of the contact hole being less than 1 μm in size and having an aspect ratio greater than 1.0.

32 Claims, 10 Drawing Sheets

SEMICONDUCTOR DEVICE HAVING A MULTI-LAYER METAL CONTACT

BACKGROUND OF THE INVENTION

The present invention relates to a semiconductor device and manufacturing method thereof, and more particularly to a semiconductor device including a wiring layer and method for forming a wiring layer. The present invention is an improvement over the invention which is the subject matter of the present inventor's co-pending U.S. patent application Ser. No. 07/828,458 filed on Jan. 31, 1992, the disclosure of which is hereby incorporated into this application by reference.

The metallization process is regarded as being the most important matter of semiconductor device manufacturing technology, since it increasingly determines the yield, performance (e.g., speed of operation), and reliability of the devices, as the technology advances toward ultra large-scale integration (ULSI). Metal step coverage was not a serious problem in less dense prior art semiconductor devices, because of the inherent features of devices having larger geometries, e.g., contact holes having low aspect ratios (the ratio of depth to width), and shallow steps. However, with increased integration density in semiconductor devices, contact holes have become significantly smaller while impurity-doped regions formed in the surface of the semiconductor substrate have become much thinner. Due to the resulting higher aspect ratio of the contact holes and larger the steps, with these current, grater-density semiconductor devices, it has become necessary, to improve the conventional aluminum (Al) metallization process, in order to achieve the standard design objectives of high-speed performance, high yield, and good reliability of the semiconductor device. More particularly, the utilization of the conventional Al metallization process in the fabrication of the higher-density integrated semiconductor devices has resulted in such problems as degraded reliability and failure of the Al interconnections due to the high aspect ratio of the contact holes and poor step coverage of the sputtered Al, increased contact resistance caused by silicon (Si) precipitation, and degradation of the shallow junction characteristics due to Al spiking.

In an effort to overcome these problems of the conventional Al metallization process, various new processes have been proposed. For example, for preventing degraded semiconductor reliability caused by the above-mentioned failure of Al interconnections ,the following processes have been proposed.

Melting methods have been disclosed in such patent publications such as Japanese Laid-Open Publication No. 62-132348 (by Yukiyosu Sugano et al.), Japanese Laid-Open Publication No. 63-99546 (by Shinpei Iijima), Japanese Laid-Open Publication No. 62-109341 (by Masahiro Shimizu et al.), Japanese Laid-Open Publication No. 62-211915 (by Hidekazu Okabayashi et al.), Japanese Laid-Open Publication No. 1-246831 (by Seiichi Iwamatsu), Japanese Laid-Open Publication No. 59-171374 (by Masaki Satou) and European Patent Application No. 87306084.3 (by Ryoichi Mukai et al.).

According to the above method, the contact hole is filled by means of melting and reflowing Al or an Al alloy. To summarize, in the reflowing step, the metal layer of Al or Al alloy is heated beyond its melting temperature, and the thus melted metal is flowed into the contact hole to fill the same. This reflowing step entails the following drawbacks and disadvantages. First of all, the semiconductor wafer must be disposed horizontally so as to allow proper filling of the contact hole with the flowing melted material. Secondly, the liquid metal layer flowed into the contact hole will seek a lower surface tension, and thus, may, upon solidifying, shrink or warp, and thereby expose the underlying semiconductor material. Further, the heat treatment temperature cannot be precisely controlled and therefore, given results are difficult to reproduce. Moreover, although these methods may fill a contact hole with the melted metal of the metal layer, the remaining areas of the metal layer (outside of the contact hole area) may become rough, thereby impairing subsequent photolithography processes. Therefore, a second metallization process may be required to smooth or planarize these rough areas of the metal layer.

As an alternative to melting Al or Al alloy for filling contact holes, and in order to improve the metal step coverage, a multiple step metallization process is disclosed in U.S. Pat. No. 4,970,176 (Clarence J. Tracy et al.). According to this above patent, a predetermined first thickness of a metal layer is deposited on a semiconductor wafer at a cold temperature. Then, the temperature is increased to approximately 400° C. to 500° C., which allows the metal layer to reflow while depositing the remaining and relatively thin second thickness of the metal layer. The reflow of the metal layer takes place through grain growth, recrystallization and bulk diffusion.

According to the Tracy et al. method, the step coverage of a contact hole (via hole) having a high aspect ratio can be improved. However, the aluminum or aluminum alloy cannot completely fill a contact hole having an aspect ratio greater than 1 and a diameter less than 1 $\mu$m.

In the meantime, Ono et al. have disclosed that when the semiconductor substrate temperature is above 500° C., the liquidity of Al—Si suddenly increases (in Proc., 1990 VMIC Conference, June 11 and 12, pp. 76-82). According to this paper, the stress of an Al-1% Si film changes abruptly near 500° C., and the stress relaxation of such a film occurs rapidly at that temperature. Additionally, the temperature of the semiconductor substrate must be maintained between 500° C. and 500° C. in order to fill the contact holes satisfactorily. This mechanism is different from the reflow of the metal layer in the Tracy et al. patent ('176).

Additionally, C. S. Park et al. (which includes some of the present inventors) have disclosed a method for forming a metal wiring layer through a contact hole having a high aspect ratio which comprises the steps of depositing an aluminum alloy to a thickness of 3000 Å at a temperature below 100° C. and post-heating the deposited aluminum alloy at a temperature of 550° C. for 180 seconds to thereby completely fill up the contact hole with aluminum alloy, in Proc., 1991 VMIC Conference, June 11 and 12, pp. 326-328. This method is now pending in the USPTO as U.S. patent application Ser. No. 07/585,218 entitled "A :Method for Forming a Metal Layer in a Semiconductor Device".

Since the metal layer is heat-treated at a temperature lower than aluminum's melting point, the metal layer does not melt. For example, instead of melting, the Al atoms deposited by sputtering at a temperature below 150° C. migrate upon heat-treatment at 550° C. This migration increases when the surface area is uneven or grainy due to an increase in energy among the surface atoms which are not in full contact with surrounding atoms. Thus, the initially sputtered, grainy layer exhibits increased atomic migration upon heat-treatment.

According to the above method, the contact hole can be easily and fully filled with metal, by using the same sputtering equipment used for the conventional deposition method and then annealing the deposited metal. Therefore, even a contact hole with a high aspect ratio can be completely filled.

However, when a void is formed in the contact hole or when the step coverage of the metal layer is inadequate, the contact hole cannot be filled up while maintaining such a semiconductor wafer with metal layer at a certain temperature and vacuum level. Further, although a secondary metal layer is subsequently formed on the semiconductor wafer having a previously deposited primary metal layer, good step coverage of the contact hole cannot be assured, and the reliability of the manufactured semiconductor device is degraded due to this inadequate step coverage.

A contact structure consisting of pure Al deposited directly onto Si was adopted in the earliest stages of silicon technology. However, the Al—to—Si contact exhibits some poor contact characteristics such as junction spiking during sintering. The sintering step is performed after the contact metal film has been deposited and patterned. For Al-to-Si contacts, such sintering causes the Al to react with the native oxide layer that forms on the silicon surface. As the Al reacts with the thin $SiO_2$ layer, $Al_2O_3$ is formed, and in a good ohmic contact, the native oxide is eventually completely consumed. Thereafter, Al diffuses through the resultant $Al_2O_3$ layer to reach the Si surface, forming an intimate metal-Si contact. Here, Al must diffuse through the $Al_2O_3$ layer to reach the remaining $SiO_2$. As the $Al_2O_3$ layer increases in thickness, the Al penetration requires more time. Thus, if the native-oxide layer is too thick, the $Al_2O_3$ layer will consequentially too thick for Al to diffuse through it. In this case, not all of the $SiO_2$ will be consumed, and a poor ohmic contact will result. The penetration rate of Al through $Al_2O_3$ is a function of temperature. For acceptable sinter temperature and sinter times, the thickness of the $Al_2O_3$ should be in the range of 5–10 Å. Since the maximum $Al_2O_3$ thickness is of the order of the consumed native oxide's thickness, an approximate upper limit to the allowable thickness of the native-oxide layer is fixed. The longer the silicon surface is exposed to an oxygen-containing ambient atmosphere, the thicker the native oxide will be. Therefore, in most contact processes, surface-cleaning procedures are performed just prior to loading the waters into the deposition chamber for metal deposition.

Aluminum absorbs 0.5 to 1% silicon at a contact-alloying temperature between 450° C. and 500° C. If a pure Al film were heated to 450° C. and a source of silicon were provided, then the Al would absorb silicon in solution until a Si concentration of 0.5 percent by weight is reached. The semiconductor substrate serves as such a source of silicon, while silicon from the substrate enters the Al by diffusion, at elevated temperatures. If a large volume of Al is available, a significant quantity of the Si from below the Al—Si interface can diffuse into the Al film. Simultaneously, the Al from the film moves rapidly to fill the voids created by the departing Si. If the penetration of the Al is deeper than the pn-junction depth below the contact, the junction will exhibit large leakage currents or even become electrically shorted. This phenomenon is referred to as junction spiking.

For alleviating the problem of junction spiking at the contacts, Si is added to the Al film as it is deposited. Aluminum-silicon alloys (1.0 wt % Si) have been widely adopted for manufacturing the contacts and interconnects of integrated circuits. The use of aluminum-silicon alloys instead of pure Al may alleviate the problem of junction spiking, but, unfortunately, causes another problem. More particularly, during the cooling cycle of the annealing process, the solubility of silicon in the Al decreases with the decreasing temperature. The aluminum thus becomes supersaturated with Si, which causes the nucleation and outgrowth of Si precipitates from the Al—Si solution. Nucleation should always occur most rapidly on the grain boundaries and interface boundaries in the decreasing order of the driving force for nucleation. Such precipitation occurs both at the Al—$SiO_2$ interface and Al—Si interface in the contacts. If these precipitates form n+Si at the contact interface, an undesirable increase in contact resistance results. Si precipitates on grain boundaries can take part in boundary-assisted nucleation and those within the Al interconnect lines can increase the susceptibility of the lines to electromigration failure. A large flux divergence in current is produced at locations where Si precipitates larger than approximately 0.4 $\mu$m are formed. This can lead to early failure of the semiconductor device due to an electromigration-induced open circuit. When forming a metal wiring layer in a semiconductor device according to the above method (that of C. S. Park), this problem becomes serious since the metal wiring layer undergoes a heating and cooling cycle during its formation.

FIG. 1. illustrates Si precipitates (8a, 8b) formed on the surface of the semiconductor substrate 2 after metallization. Here, reference numeral 7 represents the metal wiring layer. Obviously, these Si precipitates should be removed. These Si precipitates have hitherto been removed by ashing, overetching or wet etching, or by the use of an enchant including a radical which can remove the precipitates from the substrate.

In particular, when depositing the metal layer at a high temperature, the Si precipitates cannot be easily removed. When the Si precipitates are removed by overetching, the images thereof are transmitted to an underlying layer, and these images remain after the overetching. Thus, the quality and appearance of the surface of the semiconductor substrate remains poor.

It is also presently known that, for improving the reliability of the semiconductor by preventing degradation of the shallow junction characteristics due to Al spiking, a barrier layer can be formed in the contact hole formed on the semiconductor water. For example, the formation of a titanium nitride film by a reactive sputtering method is disclosed in J. Vac. Sci. Technol., A4(4), 1986, pp. 1850–1854. In U.S. Pat. No. 4,897,709 (by Natsuki Yokoyama et al.), there is described a semiconductor device which includes a titanium nitride film (barrier layer) which is formed in a contact hole for preventing a reaction between the metal wiring layer and the semiconductor substrate. The titanium nitride film can be formed by a low pressure CVD method implemented with a cold-type CVD apparatus. The resultant film has excellent characteristics with good step coverage for a considerably fine hole having a large aspect ratio. After forming the titanium nitride film, a wiring layer is formed by a sputtering method using an Al alloy.

Additionally, Yoda Dakashi et al. have suggested a method for manufacturing a semiconductor device which comprises the steps of forming double barrier layers for preventing a reaction between the wiring layer and the semiconductor substrate or an insulation layer, on the inner surface of the contact holes, and then filling the contact holes with a deposited metal such as an Al alloy while heating the semiconductor substrate to a desired temperature (Korean Laid-open Patent Publication No. 90-15277 corresponding to Japanese Patent Application No. 01-061557 filed on Mar. 14, 1989.)

Additionally, in a Japanese Patent Laid-open Publication No. 61-183942, there is described a method for forming a barrier layer which comprises the steps of forming a metal layer by depositing a metal such as Mo, W, Ti or Ta, forming a titanium nitride layer on the metal layer, and heat-treating the metal layer and the titanium nitride layer to thereby form a metal silicide layer by a reaction between the metal layer and semiconductor substrate at the intersurface thereof. Thus, the barrier characteristic is improved. However, merely forming a barrier layer is insufficient for overcoming the shortcomings and disadvantages of the above C. S. Park's metallization process.

For overcoming the above problems, S. I. Lee (also one of the present inventors) et al. has an invention now pending in the USPTO entitled "Method for Manufacturing a Semiconductor Device," and filed as U.S. patent application Ser. No. 07/828,458. This invention relates to a method for forming a metal wiring layer through a contact hole in a semiconductor device, which comprises the step of forming a first metal layer on a semiconductor wafer coated with an insulating layer having a contact hole formed thereon, using a metal selected from a group consisting of pure Al and aluminum alloys having no Si component, heat-treating the metal layer to completely fill up the contact hole with a metal of the first metal layer and then forming a second metal layer having a Si component on the first metal layer.

FIGS. 2 to 5 show a method for forming a metal wiring layer according to the above invention.

FIG. 2 illustrates a step of forming a first metal layer. More particularly, an opening 23 having a 0.8 μm diameter and having a stepped portion thereon is formed on a semiconductor substrate 21 provided with an insulating interlayer 22. Thereafter substrate 21 is cleaned.

Next, a diffusion barrier layer 24 consisting of a high-melting temperature metal compound such as TiN is deposited over the entire surface of insulating interlayer 22 and exposed portions of semiconductor substrate 21. The thickness of barrier layer 24 is preferably between 200–1500 Å. Semiconductor substrate 21 is then put into a sputtering reaction chamber, wherein a first metal layer 25 is formed by depositing a metal, e.g., aluminum or an aluminum alloy with no Si component, to a thickness of two-thirds of the desired thickness of the total (composite) metal layer (4000 Å when the desired thickness of the total metal layer is 6000 Å), at a temperature below 150° C. and under a predetermined vacuum level. First metal layer 25 thus formed has small aluminum grains and a high surface free energy.

FIG. 3 illustrates a step of filling openings 23. More particularly, the semiconductor wafer is moved into another sputtering reaction chamber without breaking the vacuum, wherein first metal layer 25 is heat-treated, preferably at a temperature of 550° C. for 3 minutes, thereby causing the atoms of aluminum to migrate into opening 23. The migration of the aluminum atoms causes the surface free energy thereof to be reduced, thereby decreasing its surface area and facilitating the completely filling of the openings with the aluminum, as shown in FIG. 3.

FIG. 4 illustrates a step of forming a second metal layer 26 on first metal layer 25. More particularly, second metal layer 26 is formed by depositing the remainder of the required thickness of the total metal layer at a temperature below 350° C., thereby completing the formation of the total metal layer. Second metal layer 26 is formed by using an aluminum alloy having a Si component, such as Al—Si or Al—Cu—Si.

FIG. 5 illustrates a metal wiring pattern 27 obtained by removing predetermined portions of second metal layer 26, first metal layer 25 and barrier layer 24, by a conventional lithography process, such as is well-known in the field of semiconductor processing.

Further, according to the invention described in the above U.S. patent application Ser. No. 07/828,458, the above second metal layer 26 may be heat-treated in the same manner as first metal layer 25, to thereby planarize the surface of the metal layer in order to improve a subsequent photolithography process before forming a metal wiring pattern 27.

According to the above invention, a metal with no Si component and a metal with a Si component are successively deposited to form a composite metal layer. A metal layer with no Si component absorbs Si atoms from the metal with the Si component, when the temperature of the semiconductor substrate is lowered. Therefore, Si precipitates are not formed on the surface of the semiconductor substrate after forming the wiring pattern.

However, when forming a composite metal layer, pure aluminum or an aluminum alloy having no Si component is deposited to form a first metal layer and then an aluminum alloy having a Si component is deposited to form a second metal layer. Therefore, if there exists a poor diffusion barrier layer formed on the inner surface of a contact hole, a fine junction spiking 15 occurs as shown in FIG. 6. Here, reference numeral 13 represents an impurity-doped region. Thus, the junction is deteriorated, which, over time, will increase leakage current.

Based upon the above, it can be appreciated that there presently exists a need for a semiconductor device including a wiring layer which does not produce a Si precipitate nor a fine Al spiking which causes leakage current and a manufacturing method thereof, which would overcome the above-described shortcomings and disadvantages of the presently available processes. The present invention has been accomplished for fulfilling this need.

SUMMARY OF THE INVENTION

Accordingly, it is an object of the present invention to provide a semiconductor device including a reliable wiring layer which does not form silicon in a subsequent heat-treating step and wherein no fine Al spiking occurs.

Another object of the present invention is to provide an improved method of forming a wiring layer for a metal wiring pattern.

In accordance with the present invention, there is provided a semiconductor device including a wiring layer comprising: a semiconductor substrate; an insulating layer having an opening formed on the semiconductor substrate, the opening exposing a portion of a surface of an underlying layer of the insulating layer; a first conductive layer formed on the insulating layer, the first conductive layer completely filling the opening, and the first conductive layer comprised of a material which does not produce a Si precipitate in a subsequent heat-treating step. The opening may be a contact hole which extends to a surface of the semiconductor substrate, thereby exposing a portion of the surface of the semiconductor substrate wherein an impurity is doped.

According to one embodiment of the present invention, the first conductive layer comprises a first metal layer having a Si component and a second metal layer having no Si component. The first metal layer may be comprised of a metal such as an Al—Si alloy (Al-1% Si)or an Al—Cu—Si alloy (Al-0.5% Cu-1%Si)and the second metal layer may be comprised of a metal such as pure aluminum, an Al—Cu alloy (Al-0.5% Cu) or an Al—Ti alloy.

According to another embodiment of the present invention, the first conductive layer is comprised of a lower portion including a Si component and located near the opening's inner surfaces, the exposed surface of the underlying layer and a surface of the insulating layer and an upper portion which does not substantially include a Si component.

According to still another embodiment of the present invention, the first conductive layer is comprised of a metal which contains not more than about 0.5 percent by weight of a Si component, preferably about 0.2–0.5 percent by weight of the Si component.

According to yet another embodiment of the present invention, the first conductive layer is comprised of a refractory metal silicide layer formed on an inner surface of the opening, on the insulating layer and on an exposed surface of the underlying layer and a metal layer formed on the refractory metal silicide layer and comprised of a metal having no Si component or a metal having not more than 0.5 percent by weight of a Si component. Suitable refractory metal silicide used in the practice of the present invention include, for example, $WSi_2$, $MoSi_2$, $TiSi_2$, $TaSi_2$ etc.

According to yet still another embodiment of the present invention, the first conductive layer is comprised of a refractory metal layer formed on an inner surface of the opening, on the insulating layer and on an exposed surface of the underlying layer, and a metal layer having a Si component formed on the refractory metal layer. Suitable refractory metals used in the practice of the present invention include, for example, Ti, Mo, W and Ta.

Further, a diffusion barrier layer may be formed on the surface of the insulting layer, on an inner surface of the opening and on an exposed surface of the underlying layer, and under the first conductive layer. The diffusion barrier may be composed of a transition metal such as titanium or a transition metal compound such as titanium nitride.

Also, a second conductive layer having a planarized surface may be formed on the first conductive layer filling up the opening. The second conductive layer is preferably comprised of a metal having no Si component. However, if the first conductive layer is comprised of a refractory metal layer and a metal layer having a Si component, the second conductive layer may be comprised of a metal having a Si component.

Still further, an anti-reflective layer may be formed on the second conductive layer having a planarized surface for improving the efficiency of a subsequent photolithography process.

According to the present invention, the opening is a contact hole or via having a step formed thereon or having a tapered shape. An aspect ratio of the opening is more than 1.0 preferably 1.0–2.0, and the size of the opening is not more than 1.0 $\mu$m, wherein the size is defined as a diameter or an average diameter in a case of a tapered contact hole.

In accordance with the present invention, there is provided a method for manufacturing a semiconductor device including a wiring layer comprising the steps of:
forming an insulating layer on a semiconductor substrate;
providing the insulating layer with an opening exposing a portion of a surface of an underlying layer of the insulating layer;
forming a first conductive layer which does not produce a Si precipitate in a subsequent heat-treating step over the insulating layer; and
heat-treating the first conductive layer for an appropriate time to fill up the opening with a material of the first conductive layer.

According to one embodiment of the present invention, the first conductive layer is obtained by subsequently depositing a first metal to form a first metal layer and a second metal to form a second metal layer. The first metal is an aluminum alloy having a Si component such as an Al—Si alloy or Al—Cu—Si alloy and the second metal is pure aluminum or an aluminum alloy having no Si component such as an Al—Ti alloy or Al—Cu alloy. The first and second metal layers are deposited preferably at a temperature below 150° C. The lower the doposition temperature is, the more easily the metal atoms migrate into the opening in subsequent heat-treatment. The thickness of the first conductive layer is preferably about one third to two-thirds of the predetermined thickness of the wiring layer.

The thickness of the first metal layer is preferably not more than one quarter of a predetermined thickness of a wiring layer, and that of the second metal layer is preferably not less than five-twelfths of a predetermined thickness of a wiring layer.

After being formed in a vacuum, the first conductive layer is heat-treated, without breaking the vacuum. The heat treatment is carried out by heating the semiconductor substrate in an inert atmosphere of 10 m Torr or less or in a vacuum of $5 \times 10^{-7}$ torr or less, at a temperature ranging from 0.8Tm to Tm (preferably 500°–550° C.), where Tm is the melting temperature of the first metal, using a gas conduction method or a rapid thermal annealing method (RTA). The heat-treatment can be carried out in an inert gas (e.g., $N_2$ or Ar) atmosphere or a reductive gas (e.g., $H_2$) atmosphere. When the metal layer is heat-treated, the metal atom migrate into the opening, in order to reduce the surface free energy thereof. As a result, the opening is completely filled up with the metal. As the metal atoms migrate into the opening, the surface area of the metal layer decreases. Therefore, an overhanging portion of the metal layer disappears from the upper portion of the opening, and the inlet area of the opening becomes larger. Thus, when depositing a second conductive layer thereafter, good step coverage of the metal layer can be obtained.

If the vacuum is broken during the above heat-treatment step, oxidation causes formation of a $Al_2O_3$ film, which prevents the Al atoms from migrating into the opening at the above temperature. Therefore, the opening cannot be completely filled up with the metal, which is obviously undesirable. The above heat-treatment step is carried out for not less than 1 minute, preferably for 1-5 minutes when using an Argon gas conduction method, and when using the RTA apparatus, the metal layer is preferably heat-treated for several cycles of about 2014 30 seconds, or continuously for about 2 minutes.

According to another embodiment of the present invention, the first conductive layer is obtained by subsequently forming a silicon layer on the insulating layer, on an innersurface of the opening and on an exposed surface of the underlying layer, and forming a metal layer comprised of a metal selected from a group consisting of pure aluminum and aluminum alloy having no Si component such as an Al—Ti alloy or Al—Cu alloy on the silicon layer. The metal layer is formed by depositing pure aluminum or an aluminum alloy in a vacuum and at a low temperature below 150° C. as above. The first conductive layer is heat-treated at a temperature ranging from $0.8Tm$ to $Tm$ where $Tm$ is the melting temperature of the metal.

According to still another embodiment of the present invention, the first conductive layer is formed by depositing an aluminum alloy having not more than about 0.5 percent by weight, preferably about 0.2-0.5 percent by weight of a Si component. Suitable aluminum alloys used in the present invention include, for example, an Al—Si alloy, an Al—Cu—Si alloy, etc. The aluminum alloy is deposited and heat-treated in the same manner as above. Here, the first conductive layer preferably has a thickness of about 10% to about 80% of a predetermined thickness of the wiring layer of a semiconductor device.

According to yet another embodiment of the present invention, the first conductive layer is obtained by subsequently forming a Si-rich refractory metal silicide layer on the insulating layer, on an inner surface of the opening and on an exposed surface of the underlying layer and a first metal layer on the refractory metal silicide layer. Suitable refractory metal silicides used in the present invention include, for example, $WSi_2$, $MoSi_2$, $TiSi_2$, $TaSi_2$, etc. The first metal layer is comprised of a metal selected from a group consisting of pure aluminum, an Al—Cu alloy, an Al—Ti alloy and an aluminum alloy having not more than 0.5 percent by weight of a Si component, etc. The first metal layer is deposited and heat-treated in the same manner as above.

According to yet still another embodiment of the present invention, the first conductive layer is obtained by subsequently forming a refractory metal layer on the insulating layer, on an inner surface of the opening and on an exposed surface of the underlying layer and a first metal layer having a Si component on the refractory metal layer. Suitable refractory metals used in the present invention include, for example, W, Mo, Ti, Ta, etc. The first metal layer is comprised of an aluminum alloy having a Si component, such as Al—Si, Al—Cu—Si, etc., and is deposited and heat-treated in the same manner as above.

Thereafter, a second conductive layer is formed by depositing a metal in the same manner as described above in connection with the forming of the first metal layer, except that the metal deposition is carried out at a temperature below 350° C. After its formation, the second conductive layer is also heat-treated in the same manner as described in connection with the first conductive layer's heat-treatment.

All the above steps are preferably carried out in an inert atmosphere of 10 m Torr or less or in a vacuum of $5 \times 10^7$ Torr or less, and without breaking the vacuum.

Further, after forming an opening on the semiconductor substrate, a diffusion barrier layer may be formed on the whole surface of the semiconductor wafer including the opening. The diffusion barrier layer may be comprised of a transition metal or transition metal compound such a titanium or titanium nitride.

Also, an anti-reflective layer may be formed on the second conductive layer for preventing unwanted reflections in subsequent photolithography steps, thereby improving the reliability of the metal wiring.

DESCRIPTION OF THE PREFERRED EMBODIMENTS

FIGS. 7 to 11 illustrate embodiments of the wiring layer which do not produce a Si precipitate according to the present invention.

Figure 1:
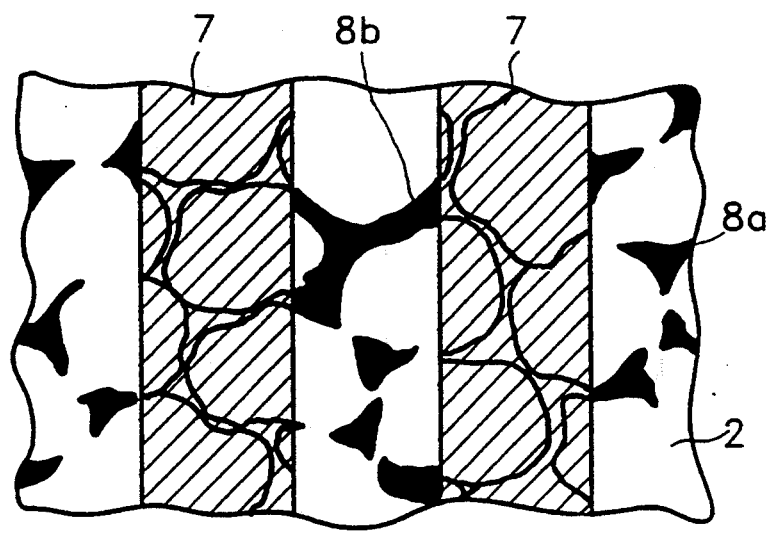
FIG. 1 illustrates Si precipitates formed on the surface of the semiconductor substrate, after forming a wiring layer according to the prior art.
Figure 2:
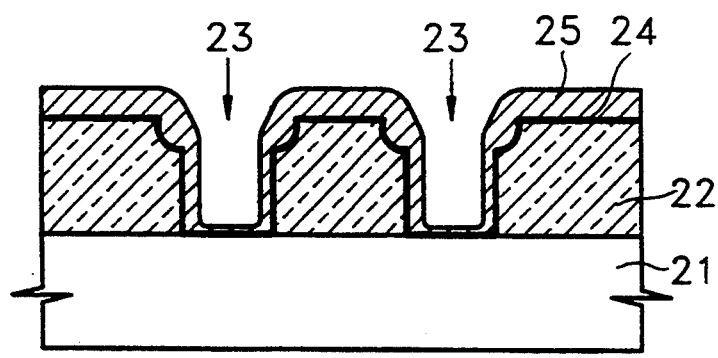
FIGS. 2 to 5 illustrate a prior method for forming a wiring layer (as described In U.S. patent application Ser. No. 07/828,458)
Figure 3:
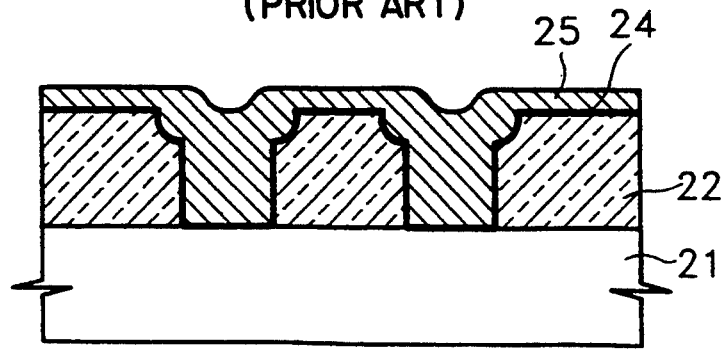
Figure 4:
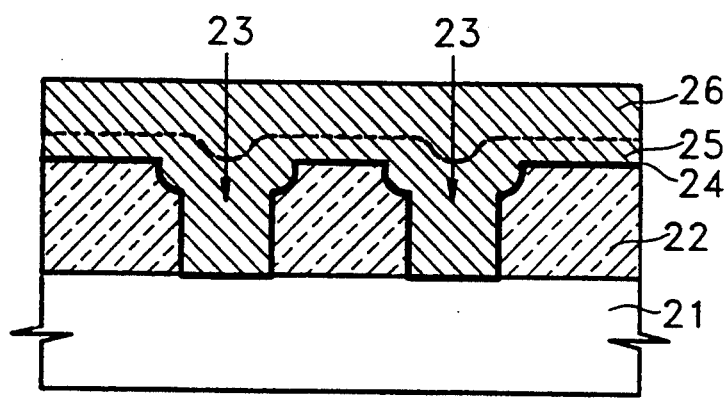
Figure 5:
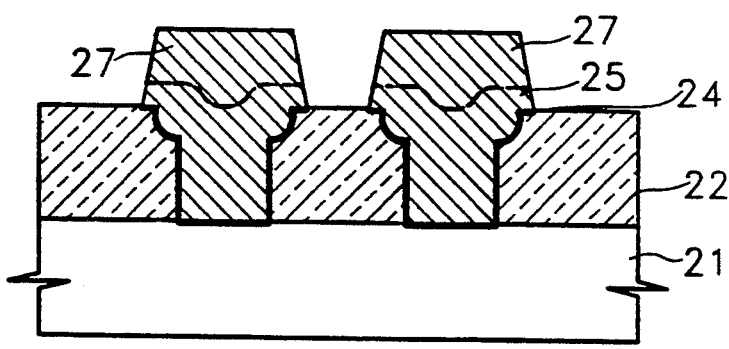
Figure 6:
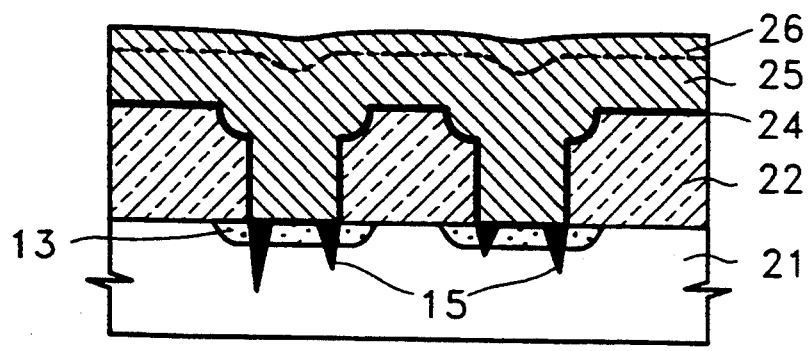
FIG. 6 illustrates fine junction spiking occurring after forming a wiring layer in the prior method of FIGS. 2 to 5.
Figure 7:
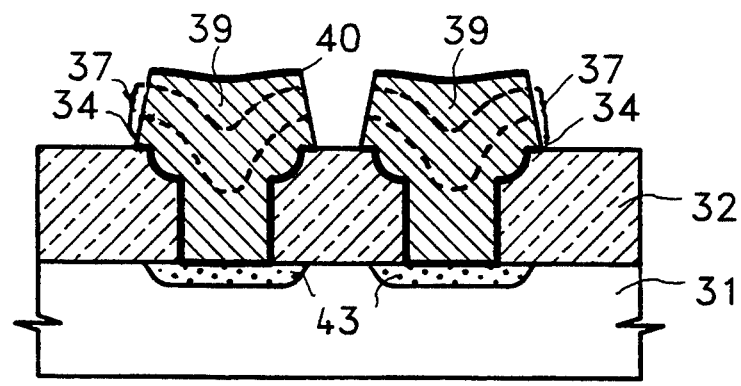
FIGS. 7 to 11 illustrate embodiments of the wiring layer according to the present invention.

FIG. 7 is a cross-sectional view of a wiring layer according to one embodiment of the present invention.

As shown in FIG. 7, the wiring layer of this embodiment comprises a semiconductor substrate 31 having an impurity-doped region 43 in a surface portion thereof; an insulating layer 32 having a contact hole as an opening having a step formed thereon; a diffusion barrier layer 34 formed on the surface of insulating layer 32, on the inner surface of the contact hole and on the exposed surface portion of semiconductor substrate 31 wherein impurity-doped region 43 has been formed, a first conductive layer 37 formed on diffusion barrier layer 34 which completely fills up the contact hole, a second conductive layer 39 having a planarized surface formed on first conductive layer 37; and an anti-reflective layer 40 formed on second conductive layer 39.

As an insulating layer used in the present invention, any conventional insulating layer such as a SiO₂ layer, BPSG layer, SOG layer, BSG layer, etc., may be mentioned. Among them, BPSG is preferably used. In this embodiment, the size of the contact hole (defined as the contact hole's diameter) is about 0.8 μm and the aspect ratio thereof is about 1.0. Diffusion barrier layer 34 consists of a first diffusion barrier composed of a transition metal such as Ti and a second diffusion barrier composed of a transition metal compound such as titanium nitride. The thicknesses of the first and second diffusion barrier layers are preferably about 200–500 Å and about 300–1500 Å, respectively.

The first conductive layer 37 is comprised of a first metal layer having a Si component and a second metal layer having no Si component. As a metal having a Si component, an Al—Si alloy (Al-1% Si alloy), Al—Cu—Si alloy (Al-0.5% Cu-1% Si alloy), etc. may be mentioned. As a metal having no Si component, pure aluminum, an Al—Cu alloy (Al-0.5% Cu alloy), Al—Ti, etc. alloy may be mentioned.

The thickness of first conductive layer 37 formed by a sputtering method is not limited as long as its thickness is enough to fill up the contact hole by heat-treating at a temperature of 0.8Tm to Tm, where Tm is the melting temperature of a metal constituting first conductive layer 37, and an overhanging portion of the conductive layer does not form during a deposition step. The thickness of the first conductive layer on the insulating layer is preferably about one third to two-thirds of a predetermined thickness of the wiring layer. More particularly, when the contact hole size is 0.8 μm and the thickness of a wiring layer is 0.6 μm, the thickness of the first conductive layer is preferably about 2,000–4,000 Å. The thicknesses of the first and second metal layers are not limited as long as the first conductive layer thus obtained does not produce a Si precipitate. Both the first and the second metal layers are preferably thicker than about 500 Å, while considering their uniformity. For preventing formation of a Si precipitate, the first metal layer preferably has a thickness not more than one quarter of a predetermined thickness of the wiring layer and the second metal layer preferably has a thickness not less than five-twelfths of a predetermined thickness of the wiring layer.

The boundary (not shown) between the first metal layer and the second metal layer may be obscure in the contact hole since they flow into the contact hole during the heat-treating step after their deposition, but still remains on the insulating layer .

Second conductive layer 39 having a planarized surface is comprised of a metal having no Si component as above. The thickness of second conductive layer 39 is preferably about one third to two-thirds of a predetermined thickness of a wiring layer. More particularly, in this embodiment, second conductive layer 39 has a thickness of about 2,000–4,000 Å on the insulating layer 32.

Anti-reflective layer 40 formed on second conductive layer 39 prevents unwanted reflections in subsequent photolithography step, for example, for forming a wiring pattern. Anti-reflective layer 40 is preferably composed of a transition metal compound such as titanium nitride.

Figure 8:
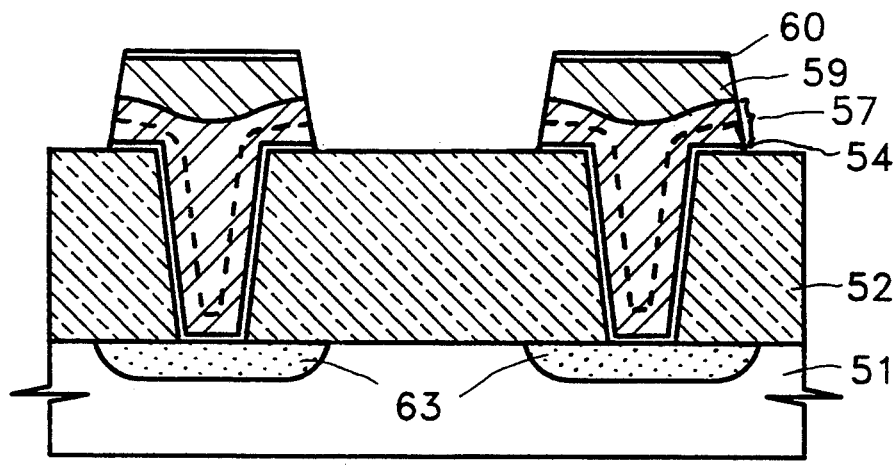

FIG. 8 is a cross-sectional view of a wiring layer according to another embodiment of the present invention.

As shown in FIG. 8, the wiring layer of this embodiment comprises a semiconductor substrate 51 having an impurity-doped region 63 in a surface portion thereof, an insulating layer 52 having a tapered contact hole, a diffusion barrier layer 54 formed on the surface of the insulating layer 52, on the inner surface of the contact hole and on the exposed surface portion of semiconductor substrate 51 wherein impurity-doped region 63 has been formed, a first conductive layer 57 formed on diffusion barrier layer 54 which completely fill the contact hole, a second conductive layer 59 having a planarized surface formed on first conductive layer 57, and an anti-reflective layer 60 formed on second conductive layer 59. The contact hole as an opening in this embodiment has a size of about 0.8 μm and an aspect ratio of about 1-2. Here, the size of the contact hole is defined as the average diameter of the taper-shaped contact hole and the aspect ratio calculation thereof uses this average diameter.

First conductive layer 57 comprises a lower portion including Si component and located near an inner surface of the contact hole, an exposed surface of semiconductor substrate 51 and a surface of the insulating layer 52 and an upper portion including substantially no Si component.

There may be no boundary line (the dotted line) between the lower and the upper portions of the first conductive layer 57, since a metal layer having no Si component absorbs Si component from a silicon layer formed under the metal layer, which has disappeared during the heat-treating step for filling up the contact hole. Si atoms diffuse from the silicon layer into the metal layer during the heat-treating step. Therefore, a Si-concentration gradient portion may be formed between the upper and the lower portions.

The thickness of first conductive layer 57 on insulating layer 52 is preferably about one third to two-thirds of a predetermined thickness of the wiring layer.

The same explanation concerning the other portions such as insulating layer 52, diffusion barrier layer 54, second conductive layer 59, and anti-reflective layer 60 will be given as the description with respect to FIG. 7.

Figure 9:
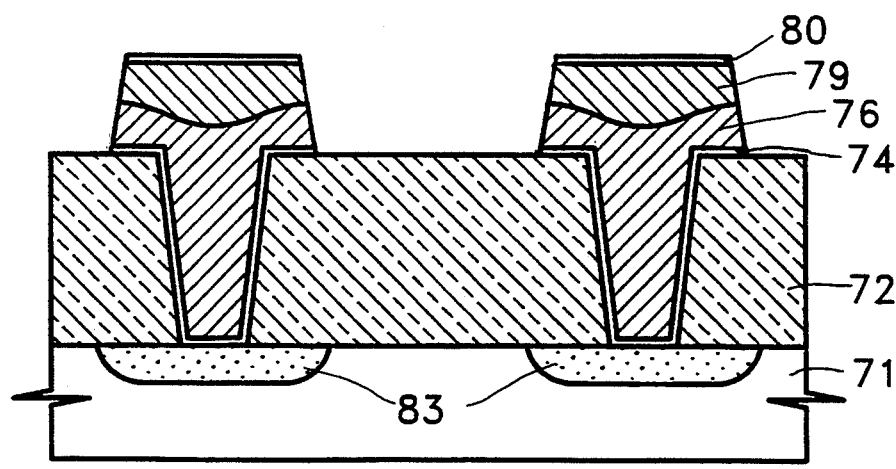

FIG. 9 is a cross sectional view of a wiring layer according to another embodiment of the present invention.

As shown in FIG. 9, the wiring layer of this embodiment comprises a semiconductor substrate 71 having an impurity-doped region 83 in a surface portion thereof, an insulating layer 72 having a tapered contact hole, a diffusion barrier layer 74 formed on the surface of insulating layer 72, on the inner surface of the contact hole and on the exposed surface portion of semiconductor substrate 71 wherein impurity-doped region 83 has been formed, a first conductive layer 76 formed on diffusion barrier layer 74 which completely fills the contact hole, a second conductive layer 79 having a planarized surface formed on first conductive layer 76, and an anti-reflective layer 80 formed on second conductive layer 79.

In this embodiment, first conductive layer 76 is comprised of a metal having not more than about 0.5 percent by weight (preferably about 0.2–0.5 percent by weight) of silicon such as Al—Si alloy (Al-0.5% Si alloy) or Al—Cu—Si alloy (Al-0.5% Cu-0.5% Si alloy). If the Si concentration is grater than 0.5 percent by weight, a Si precipitate is formed after a subsequent heat-treating step. If the Si concentration is lower than 0.2 percent by weight, an Al spiking might occur, thereby deteriorating the reliability of the wiring layer.

The thickness of first conductive layer 76 is preferably about 10–80% of a predetermined thickness of the wiring layer.

The same explanation concerning the other portions such as the contact hole, insulating layer 72, diffusion barrier layer 74, second conductive layer 79, and anti-reflective layer 80 will be given as the description with respect to FIG. 8.

Figure 10:
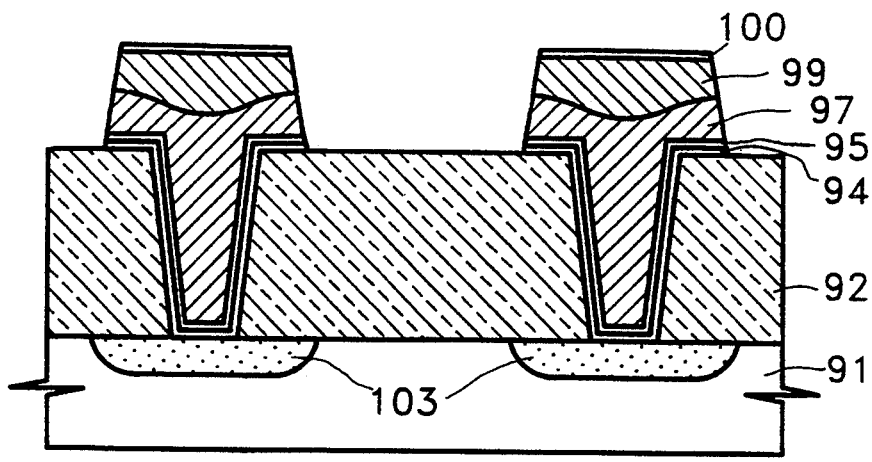

FIG. 10 is a cross-sectional view of a wiring layer according to still another embodiment of the present invention.

As shown in FIG. 10, the wiring layer of this embodiment comprises a semiconductor substrate 91 having an impurity-doped region 103 in a surface portion thereof, an insulating layer 92 having a tapered contact hole, a diffusion barrier layer 94 formed on the inner surface of insulating layer 92, on the inner surface of the contact hole and on the exposed surface portion of semiconductor substrate 91 wherein impurity-doped region 103 has been formed, a first conductive layer comprised of a refractory metal silicide layer 95 formed on diffusion barrier layer 94 and a first metal layer 97 filling the contact hole completely, a second conductive layer 99 having a planarized surface formed on the first metal layer 97 and an anti-reflective layer 100 formed on second conductive layer 99.

Since a silicon-rich refractory metal silicide layer 95 is first formed and a metal layer 97 is formed on the refractory metal silicide layer 95 and then first metal layer 97 is heat-treated to thereby completely fill the contact hole, first metal layer 97 absorbs Si atoms from refractory metal silicide layer 95 during the heat-treatment step. Thus, a Si precipitate is not formed and aluminum spiking also is prevented.

As a metal used in this embodiment, pure aluminum, an Al-alloy having no Si component such as Al—Cu alloy (Al-0.5% Cu alloy) or Al—Ti alloy, an aluminum alloy having not more than 0.5 percent by weight of Si component such as Al—Cu (Al-0.5% Cu alloy) or Al—Cu—Si alloy (Al-0.5% Cu-0.5% Si alloy) may be mentioned. As the refractory metal silicide used in this embodiment, $WSi_2$, $MoSi_2$, $TiSi_2$, $TaSi_2$, etc. may be mentioned.

The thickness of the refractory metal silicide layer 95 is preferably about 200–1,000 Å, and that of first metal layer 97 is preferably about one third to two-thirds of the predetermined thickness of the wiring layer, that is, about 2,000–4,000 Å.

After heat-treating step, the lower portion of first metal layer 97 include the refractory metal silicide component. Similar explanation in this regard will be given as the description with respect to FIG. 9.

The same explanation concerning the other portions such as the contact hole, insulating layer 92, diffusion barrier layer 94, second conductive layer 99 and the anti-reflective layer 100 will be given as the description with respect to FIG. 8.

Figure 11:
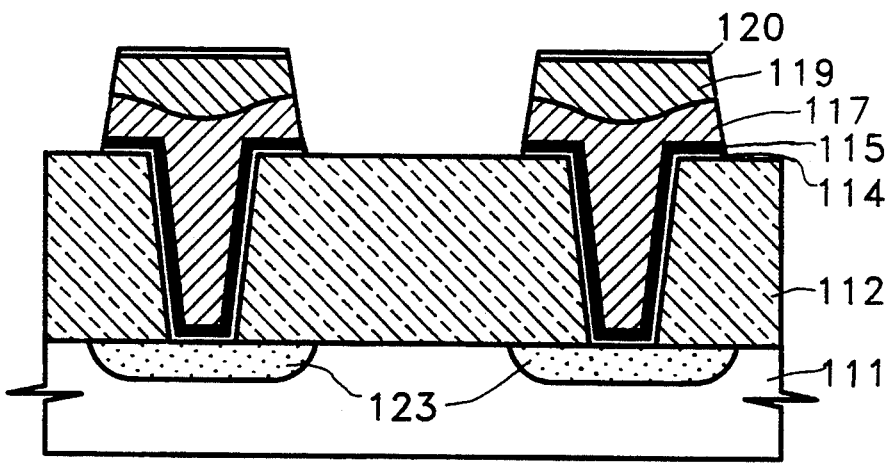

FIG. 11 is a cross-sectional view of a wiring layer according to still another embodiment of the present invention.

As shown in FIG. 11, the wiring layer of this embodiment comprises a semiconductor substrate 111 having an impurity-doped region 123 in a surface portion thereof, an insulating layer 112 having a tapered contact hole, a diffusion barrier layer 114 formed on the inner surface of insulating layer 112, on the inner surface of the contact hole and on the exposed surface portion of the semiconductor substrate 111 wherein the impurity-doped region 123 has been formed, a first conductive layer comprised of a refractory metal layer 115 formed on the diffusion barrier layer 114 and a first metal layer 117 having a Si component and filling the contact hole completely, a second conductive layer 119 having a planarized surface formed on first metal layer 117 and an anti-reflective layer 120 formed on second conductive layer 119.

As a refractory metal used in this embodiment, W, Mo, Ti, Ta, etc. may be mentioned. The thickness of the refractory metal layer 115 is below 500 Å, preferably 100–300 Å. As a metal having a Si component used in this embodiment, an Al—Si alloy (Al-1% Si alloy), an Al—Cu—Si alloy (Al-0.5% Cu-1% Si alloy), etc. may be mentioned. The thickness of the metal layer 117 is about 10–80%, preferably about one third to two-thirds of a predetermined thickness of the wiring layer, that is, 2,000–4,000 Å.

Since refractory metal layer 115 absorbs Si atoms from metal layer 117 having a Si component to form refractory metal silicide near the inter-surface between metal layer 117 and refractory metal layer 115, during the heat-treating step, a Si precipitate is not formed and aluminum spiking is prevented. The refractory metal silicide may be diffused into metal layer 115 to thereby increase the solubility of Si in the metal layer.

Hereinafter, methods for forming a wiring layer according to the present invention will be described in detail with reference to the following embodiments.

EMBODIMENT 1

FIGS. 12 to 17 illustrate one embodiment of a method for forming a wiring layer according to the present invention.

Figure 12:
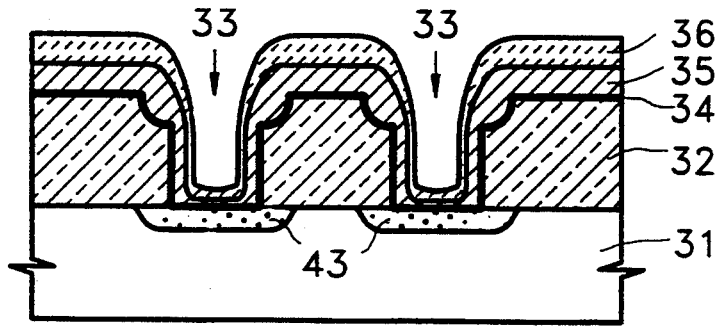
FIGS. 12 to 17 illustrate one embodiment of a method for forming a wiring layer according to the present invention.

FIG. 12 illustrates a step for forming a first conductive layer which does not produce a Si precipitate. More particularly, an opening 33 exposing a surface portion of an underlying layer is formed on a semiconductor substrate 31 provided with an insulating layer 32, and then semiconductor substrate 31 is cleaned. Here, opening 33 is a contact hole having a 0.8 μm diameter and a stepped portion thereon. The aspect ratio thereof is about 1.0. The contact hole exposes a portion of the surface of an impurity-doped region 34 formed in semiconductor substrate 31. The insulating layer 32 is comprised of borophosphorous silicate (BPSG).

Next, a diffusion barrier layer 34 is formed to a thickness of about 200–1,500 Å on the entire surface of insulating layer 32, on the inner surface of opening 33 and on exposed surface portion of semiconductor substrate 31. Diffusion barrier layer 34 is comprised of a material selected from a group consisting of transition metals such as Ti and transition metal compounds such as TiN. Preferably, diffusion barrier layer 34 is a single layer of TiN. However, it is preferable that a composite layer consisting of a first diffusion barrier layer comprised of a transition metal and a second barrier layer comprised of a transition metal compound is formed as diffusion barrier layer 34. The composite layer as the diffusion barrier layer 34 may be formed by depositing a transition metal such as Ti on the surface of insulating layer 32, on the inner surface of opening 33 and on an exposed surface portion of the semiconductor substrate 31 to form a first diffusion barrier layer to a thickness of about 200–500 Å, depositing on the first diffusion barrier layer a transition metal compound such as TiN to form a second diffusion barrier layer in a thickness of about 300–1,500 Å, and then heat-treating the diffusion barrier layer at a temperature of about 450°–550° C. in a nitrogen or ammonia atmosphere or about 30–60 minutes.

Thereafter, a first conductive layer is formed on diffusion barrier layer 34 by depositing a first metal to form a first metal layer 35 and a second metal to form a second metal layer 36 in a vacuum at a low temperature. The first metal is an aluminum alloy having a Si component such as Al—Si alloy (Al-1% Si alloy) or Al—Cu—Si alloy (Al-0.5% Cu-1% Si alloy) and the second metal is pure aluminum or an aluminum alloy having no Si component such as Al—Cu alloy (Al-0.5% Cu alloy) or Al—Ti alloy. The first metal and the second metal are deposited at a temperature below 150° C. by a sputtering method. When the wiring layer has a thickness of 6,000 Å, first metal layer 35 has a thickness not more than 1,500 Å and second metal layer 36 has a thickness not less than 2,500 Å. It is preferable that first metal layer 35 has a thickness of about 750–1,500 Å and second metal layer 36 has a thickness of about 2,500–3,250 Å. The first conductive layer preferably has a thickness of about one third to two-thirds of a predetermined thickness of the wiring layer to be formed. The first and second metal layers thus-obtained have small aluminum grains and a high surface-free energy.

Figure 13:
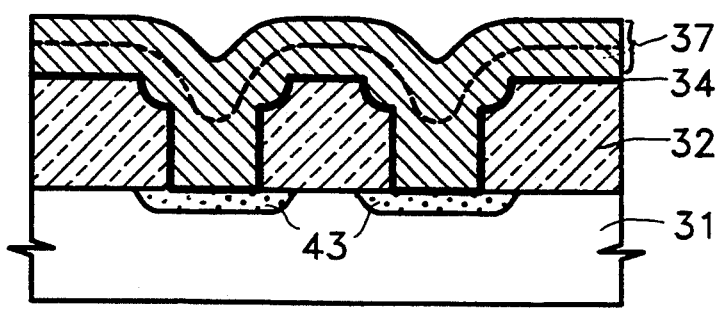

FIG. 13 illustrates a step of filling up opening 33 with a material of the first conductive layer. More particularly, the semiconductor wafer is moved into another sputtering reaction chamber without breaking the vacuum, wherein the first conduction layer is heat-treated using an Argon conduction method, preferably at a temperature of about 500°–550° C. for about 1–5 minutes, thereby causing the atoms of aluminum and aluminum alloy to migrate into opening 33. The migration of the atoms of aluminum causes its surface free energy to be reduced, thereby decreasing its surface area and facilitating the complete filling of openings 33 with the first conductive layer material, as shown in FIG. 7.

Since a metal having a Si component an a metal having no Si component are successively deposited to form a composite metal layer as a first conductive layer, a metal layer having no Si component absorbs Si atoms from the metal layer having a Si component, during the heat-treating step. Therefore, Si precipitates are not formed on the surface of tile semiconductor substrate alter forming the wiring pattern, and Al spiking is eliminated.

This heat-treatment step may be carried out in an inert gas (e.g., $N_2$, or Ar) atmosphere or a reductive gas (e.g., $H_2$) atmosphere. Instead of the above Argon conduction method, other heat-treating methods such as RTA (Rapid Thermal Annealing), lamp heating, etc. can be used. These heat-treating methods may be used alone or in combination with others.

In FIG. 13, reference numeral 37 represents the first conductive layer which completely fills the opening 33.

Figure 14:
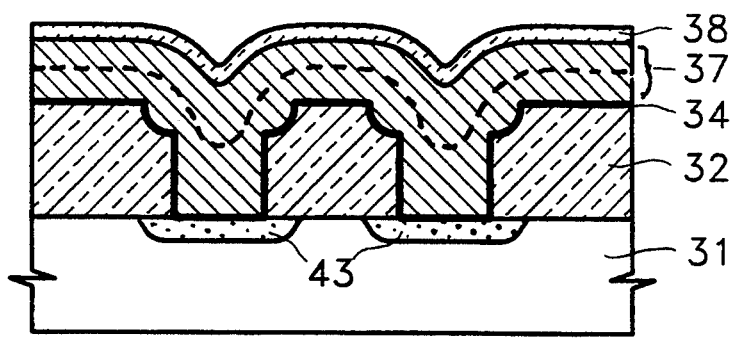

FIG. 14 illustrates a step of forming a second conductive layer 38 on the first conductive layer 37 heat-treated as above. More particularly, the second conductive layer 38 is formed by depositing a metal without breaking the vacuum at a temperature below 350° C. using a sputtering method to form a third metal layer, so that the wiring layer has the required total thickness. When the required total thickness of the wiring layer is 6,000 Å, the third metal layer preferably has a thickness of about 2,000–4,000 Å. As a metal for the third metal layer, a metal having no Si component such as on Al—Cu alloy (Al-0.5% Cu alloy) or Al—Ti alloy is used.

Figure 15:
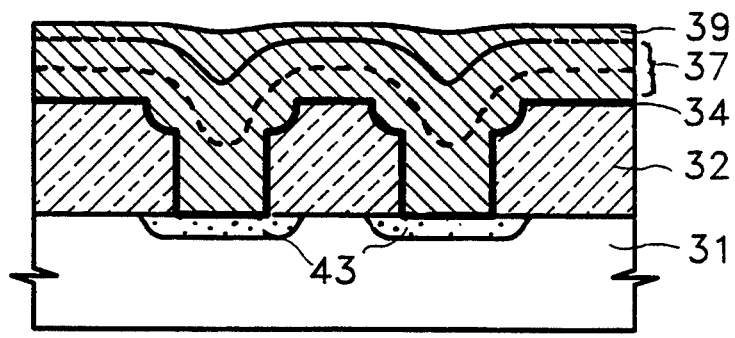

FIG. 15 illustrates a step of a heat-treating the second conductive layer 38, to thereby planarize the surface of the wiring layer. The reference numeral 39 represents the heat-treated second conductive layer. This step is carried out in the same manner as the first conductive layer, without breaking the vacuum.

Performing this step enables the atoms of the metal layer to migrate into opening 33, thereby filling it more completely to result in a wholly planarized wiring layer. Thus, subsequent photolithography steps can be more easily and effectively carried out.

Figure 16:
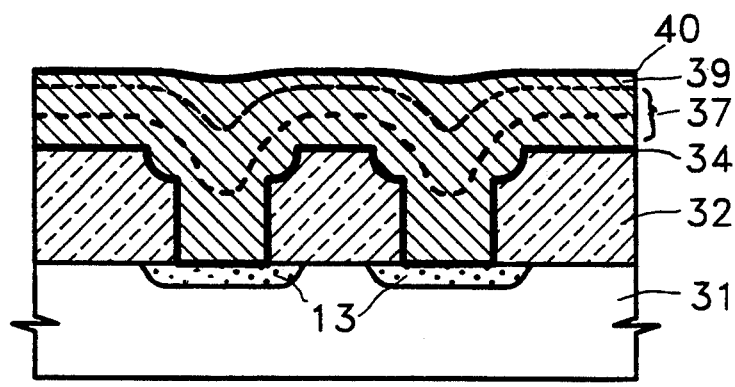

FIG. 16 illustrates a step of forming an anti-reflective layer 40. The anti-reflective layer 40 is formed by depositing titanium nitride to a thickness of 200–500 Å on the surface of the heat-treated second conductive layer 39, using a sputtering method. This improves the subsequent photolithography process.

Figure 17:
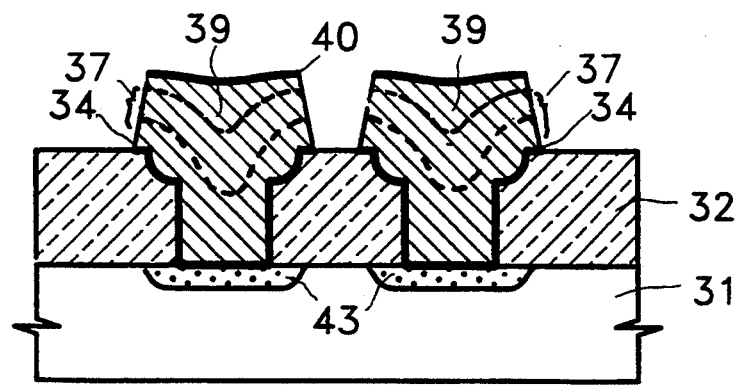

FIG. 17 illustrates a step of forming a wiring pattern. After forming anti-reflective layer 40, a predetermined resist pattern (not shown) for the wiring layer of a semiconductor device is formed on anti-reflective layer 40 by a conventional photolithography process, and then using the above resist pattern as an etching mask, anti-reflective layer 40, second conductive layer 39, first conductive layer 37 and diffusion barrier layer 34 are subsequently etched to complete the wiring layer as shown in FIG. 7 according to the present invention.

EMBODIMENT 2

FIGS. 18 to 22 illustrate another embodiment of a method for forming a wiring layer according to the present invention.

Figure 18:
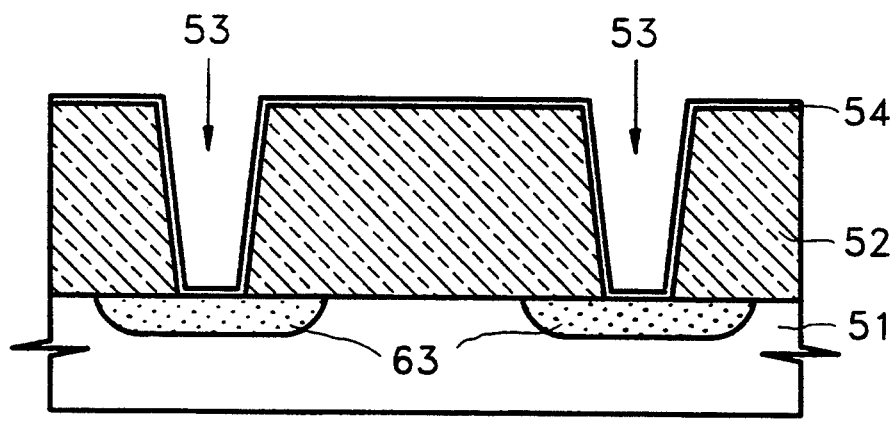
FIGS. 18 to 22 illustrate another embodiment of a method for forming a wiring layer according to the present invention.

FIG. 18 illustrates a step of forming a diffusion barrier layer 54. More particularly, an 0.8–1.6 μm thick insulating layer 52 having a thickness of about 0.8–1.6 μm is formed on a semiconductor substrate 51 having an impurity-doped region 63 in a surface portion thereof. Then, insulating layer 52 is provided with an opening 53 formed on impurity-doped region 63.

Here, in size opening 53 is a contact hole being about 0.8 μm diameter and having a tapered shape, and exposes a portion of the surface of semiconductor substrate 51 wherein an impurity-doped region 63 is formed. The size of the contact hole is given as the mean value of all the diameters of the tapered contact hole. The largest diameter is about 0.9–1.0 μm and the smallest diameter is about 0.60–0.7 μm. The aspect ratio (the ratio of the depth to the size) of the above contact hole is about 1.0–2.0.

Next, a diffusion barrier layer 54 is formed and heated in a same manner as in embodiment 1.

Figure 19:
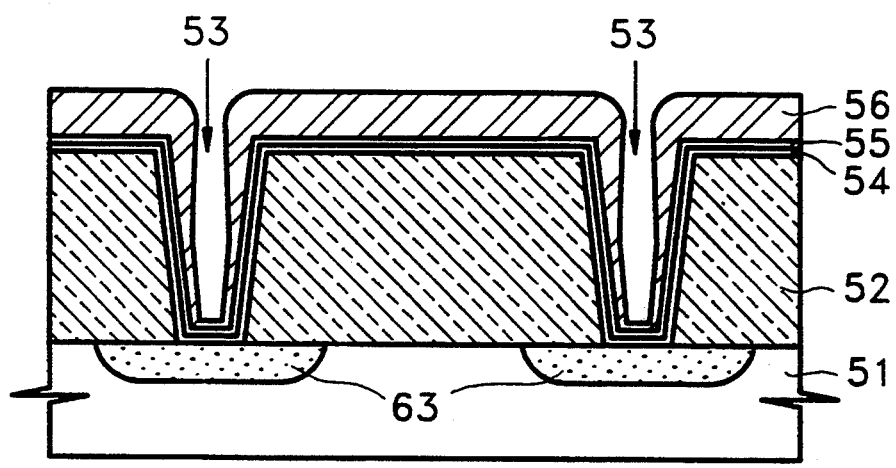

FIG. 19 illustrates a step of forming a first conductive layer consisting of a silicon layer 55 and a first metal layer 56. After forming diffusion barrier layer 54, amorphous silicon is deposited to form a silicon layer 55 having a thickness of about 50–200 Å. The amorphous silicon is deposited at a temperature of 450°–540° C. by an LPCVD method using $Si_2H_6$ as a source gas, at a rate of about 1.3 Å per minute., or using $SiH_4$ as a source gas at a rate of about 1 Å per minute. When the silicon layer is formed by the LPCVD method, an $Ar^+$ radio frequency (RF) etching step is necessary for preventing the surface for the silicon layer 55 from oxidation during its exposure to an atmosphere before forming a metal layer. Here, Ar+ RF etching is carried out using at a bias voltage of about 960 V.

The etching rate is about 1.6 Å per second and the temperature of semiconductor substrate 51 is about 200° C. The silicon layer thus obtained preferably has a thickness of 20-30 Å.

Alternatively, the amorphous silicon layer 55 may be deposited to a thickness of about 20-30 Å by a sputtering method using silicon (e.g. boron-doped silicon) as a target. When amorphous silicon layer 55 is deposited by a sputtering method in a vacuum, a metal layer may be formed by a sputtering method without breaking the vacuum. Therefore, before forming a metal layer, the Ar+ RF etching step as above is unnecessary, since there is no probability that the surface of silicon layer 55 is exposed to an atmosphere to thereby form native oxide.

Thereafter, a metal having no Si component such as pure aluminum, an Al—Cu alloy (Al-0.5% Cu) or Al—Ti alloy is deposited to form a first metal layer 56 having a thickness of about 500–4,000 Å, and preferably about 2,000–4,000 Å.

Figure 20:
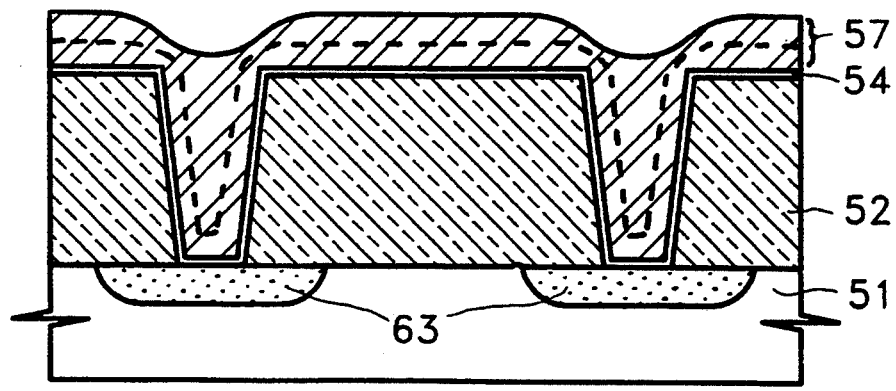

FIG. 20 illustrates a step of filling up opening 53 with a material of the first conductive layer by heat-treating. This step is carried out in the same manner as embodiment 1 at a temperature of 0.8Tm to Tm, wherein Tm is the melting temperature of metal of first metal later 56.

During this heat-treating step, the aluminum atoms of metal layer 56 migrate into opening 53 (i.e., the contact hole), completely filling it, while first metal layer 56 absorbs almost all of the Si atoms from silicon layer 55. If all the silicon atoms are absorbed into the first metal layer, silicon layer 55 disappears and a lower portion of the first conductive layer having a Si component will form near the inner surface of opening 53, the surface of insulating layer 52 around opening 53, and the surface of the semiconductor substrate 51, and an upper portion of the first conductive layer having substantially no Si component will also form. If the first metal layer is thinner than silicon layer 55, the first conductive layer will produce a Si precipitate. Therefore, the thicknesses of silicon layer 55 and first metal layer 56 are adjusted so that the first conductive layer has not more than 0.5% by weigh of silicon. The first conductive layer thus heat-treated completely fill up opening 53, and produces no Si precipitate.

In FIG. 20, reference numeral 57 represents the first conductive layer after the heat-treatment step which completely fills opening 53.

It is preferable that the thickness of the first conductive layer is one third to two-thirds of a predetermined thickness of the wiring layer of the semiconductor device.

Figure 21:
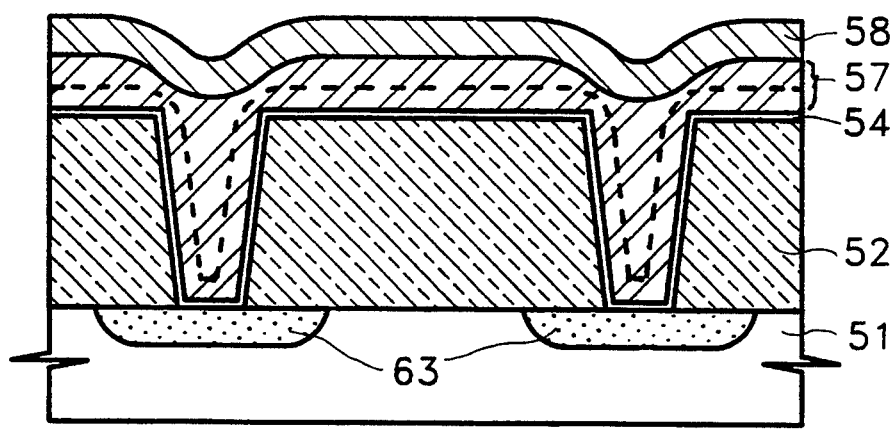

FIG. 21 illustrates a step for forming a second conductive layer 58 on the first conductive layer thus heat-treated.

After the above heat-treating step, a second conductive layer 48 is formed by depositing a metal with no Si component to form a metal layer having a thickness of about 2,000–5,500 Å (preferably about 2000–4000 Å), so that first and second conductive layers have the desired thickness of the wiring layer. The thickness of second conductive layer 58 is preferably about one third to two-thirds of the wiring layer.

This second conductive layer 58 is formed in the same manner as in embodiment 1.

Figure 22:
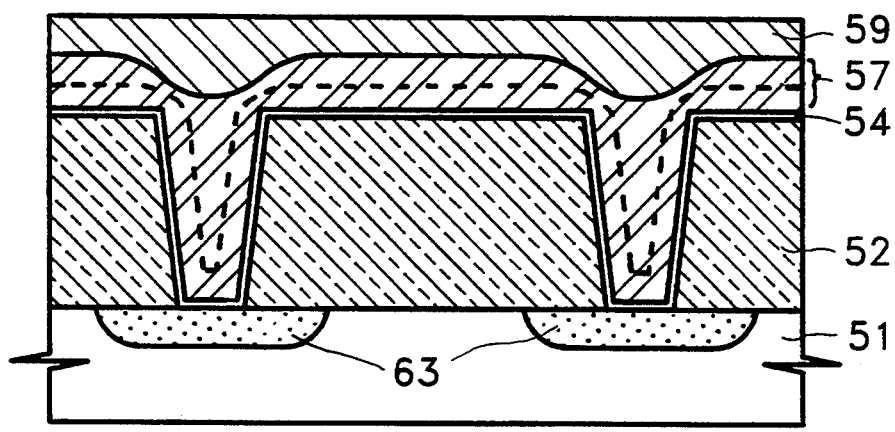

FIG. 22 illustrates a step of heat-treating the above second conductive layer 58 to thereby planarize the surface of the wiring layer. Here, reference numeral 59 represents the heat-treated second conductive layer having a planarized surface. This step is also carried out in the same manner as in embodiment 1.

Further, all the subsequent steps for completing a wiring layer as shown in FIG. 8 are carried out in the same manner as in embodiment 1. Therefore, explanation concerning these steps is omitted.

EMBODIMENT 3

Figure 23:
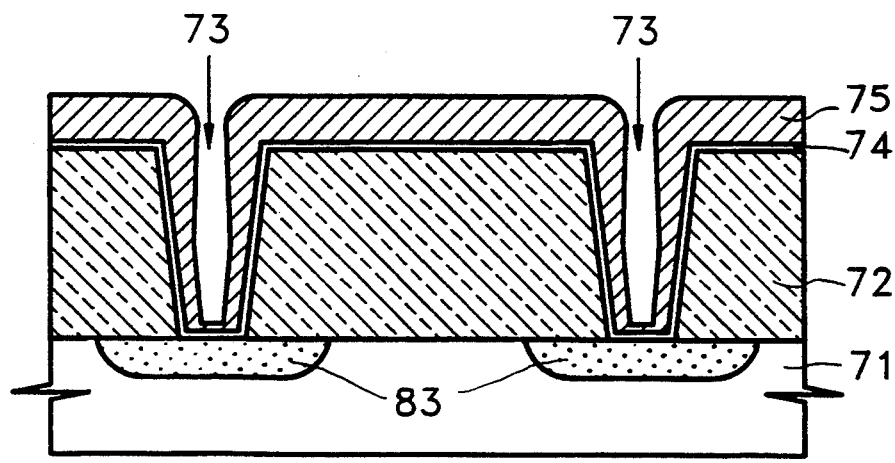
FIGS. 23 to 25 illustrate still another embodiment of a method for forming a wiring layer according to the present invention.
Figure 24:
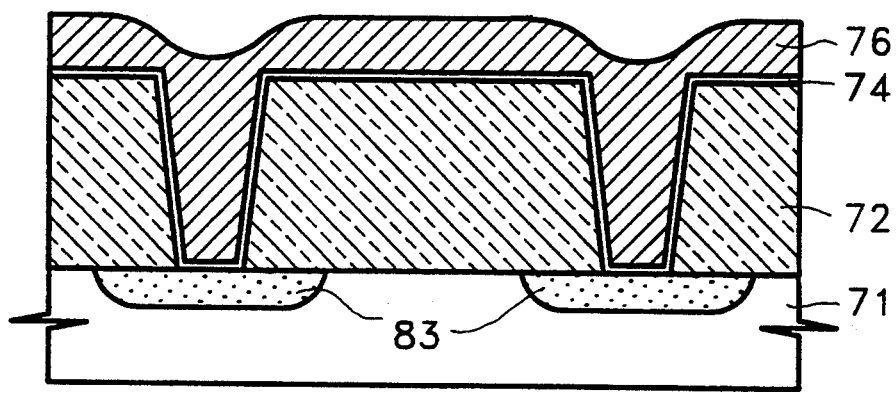
Figure 25:
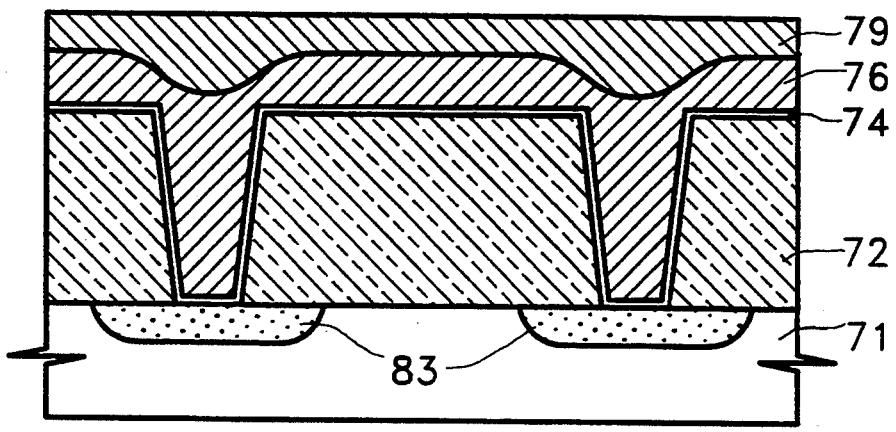

FIGS. 23 to 25 illustrate still another embodiment of a method for forming a wiring layer according to the present invention.

FIG. 23 illustrates a step for forming a metal layer 75 as a first conductive layer by depositing a metal having not more than about 0.5 percent by weight of silicon. More particularly, an insulating layer 72 is formed on a semiconductor substrate 71 having an impurity-doped region 83 in a surface portion thereof, and then a contact hole as an opening 73 is formed on impurity-doped region 83. Thereafter, a diffusion barrier layer 74 is formed and then heat-treated. These steps are carried out in the same manner as in embodiment 2.

Then, the first conductive layer is obtained by depositing an aluminum alloy e.g., Al-0.5% Si alloy or Al-0.5% Cu-0.5% Si alloy, having not more than about 0.5 percent by weight of silicon, (preferably about 0.2–0.5 percent by weight), to form a metal layer 75 having a thickness of about 10–80% of a predetermined thickness of a wiring layer. When the wiring layer has a thickness of 6,000 Å, metal layer 75 preferably has a thickness of 4,000 Å. If metal layer 75 is formed by depositing an aluminum alloy having a Si component of more than 0.5 percent by weight, a Si precipitate will form on the surface of the semiconductor substrate as the temperature is lowered.

FIG. 24 illustrates a step for filling up opening 73 with the metal of the first conductive layer by heat-treating. The heat-treating step is carried out in the same manner as in embodiment 2, at a temperature of about 500°-550° C. for about 1–5 minutes, to completely fill opening 73 with the metal. Here, reference numeral 76 represents the first conductive layer after the heat-treatment step which completely fills opening 73.

Then, a second metal layer as a second conductive layer is formed by depositing or pure Al an aluminum alloy having no Si component such as Al—Cu alloy (Al-0.5% Cu alloy) or Al—Ti alloy to a predetermined thickness, so that the wiring layer has a desired thickness. In this embodiment, the thickness of the second metal layer as a second conductive layer is about 2,000 Å. The second conductive layer thus obtained is also heat-treated in the same manner as in embodiment 2.

FIG. 25 illustrates a second conductive layer after a heat-treating step of the second conductive layer, the surface of which is planarized to thereby give a planarized wiring layer. Here, reference numeral 79 represents the heat-treated second conductive layer.

The subsequent steps for completing a wiring layer as shown in FIG.9 are carried out in the same manner as in embodiment 2.

EMBODIMENT 4

Figure 26:
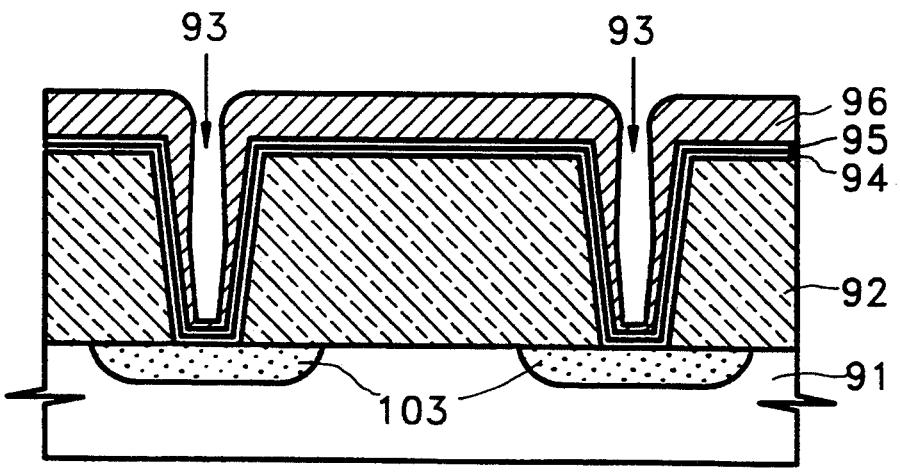
FIGS. 26 to 28 illustrate yet another embodiment of a method for forming a wiring layer according to the present invention.
Figure 27:
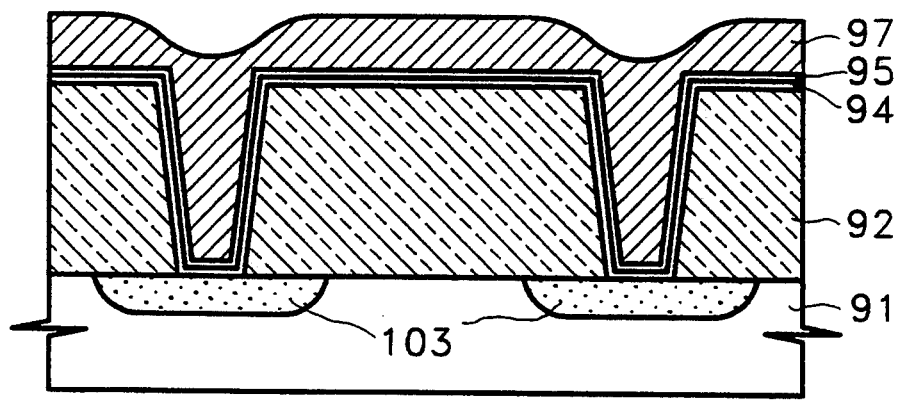
Figure 28:
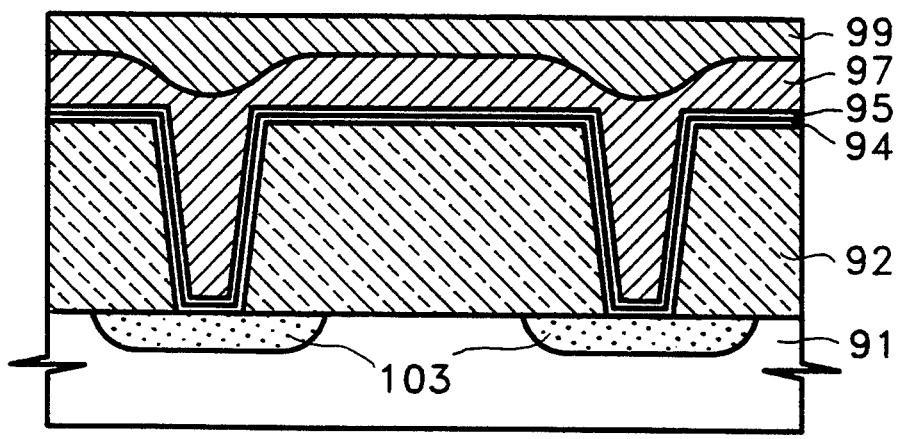

FIGS. 26 to 28 illustrate yet another embodiment of a method for forming a wiring layer according to the present invention.

FIG. 26 illustrates a step of forming a first conductive layer consisting of a silicon-rich refractory metal silicide layer 95 and a first metal layer 96. More particularly, an insulating layer 92 having an opening 93 is formed on a semiconductor substrate 91 in the same manner as in embodiment 2. Opening 93 is a tapered contact hole located over an impurity-doped region 103. Then, a diffusion barrier layer 94 is formed and heat-treated in the same manner as embodiment 1.

Thereafter, a silicon-rich refractory metal silicide layer 95 is formed on the diffusion barrier layer 94, is comprised of any one selected from a group consisting of $WSi_2$, $MoSi_2$, $TiSi_2$, $TaSi_2$, etc. refractory metal silicide layer 95 preferably has a thickness of 200–1,000 Å, and may be formed by CVD method or a sputtering method using a refractory metal silicide as a target.

Then, a first metal layer 96 is formed by depositing a metal such as pure aluminum, an Al—Cu alloy (Al-0.5% Cu alloy), an Al—Ti alloy, or an aluminum alloy having not more than 0.5 percent by weight of a Si component, to a thickness of about 2,000–4,000 Å in the same manner as in embodiment 2.

FIG. 27 illustrates a step of filling up opening 93 with the material of the first conductive layer by heat-treating.

The heat-treating step is carried out in the same manner as in embodiment 2. Here, reference numeral 97 represents the first metal layer after the heat-treatment step which completely fills opening 93.

Thereafter, a second conductive layer is formed and then heat-treated in the same manner as in embodiment 2.

The second conductive layer is formed by depositing pure aluminum, or an aluminum alloy having no Si component such as Al—Cu alloy (Al-0.5% Cu alloy) or Al—Ti alloy to a predetermined thickness. In this embodiment, the second conductive layer preferably has a thickness of about 2,000–4,000 Å.

FIG. 28 illustrates a second conductive layer after the heat-treating step of the second conductive layer, the surface of which is planarized to consequently give a planarized wiring layer. Here, reference numeral 99 represents the heat-treated second conductive layer.

The subsequent steps for completing a wiring layer as shown in FIG. 10 are carried out in the same manner as in embodiment 2.

EMBODIMENT 5

Figure 29:
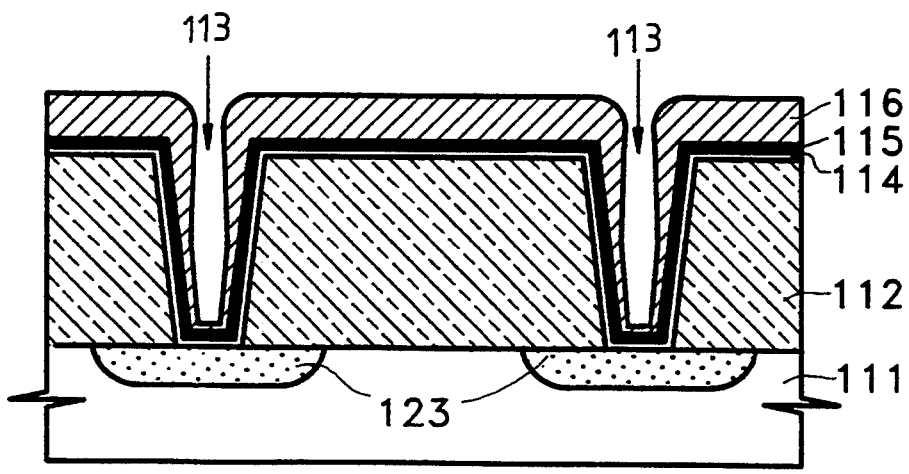
FIGS. 29 to 31 illustrate yet another embodiment of a method for forming a wiring layer according to the present invention.
Figure 30:
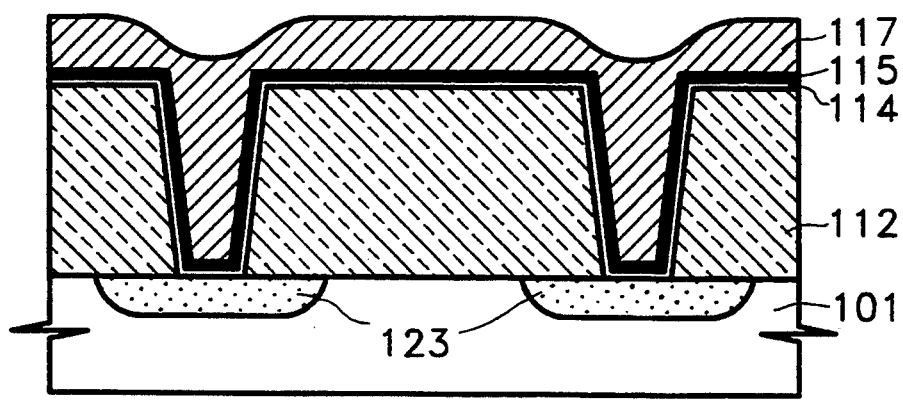
Figure 31:
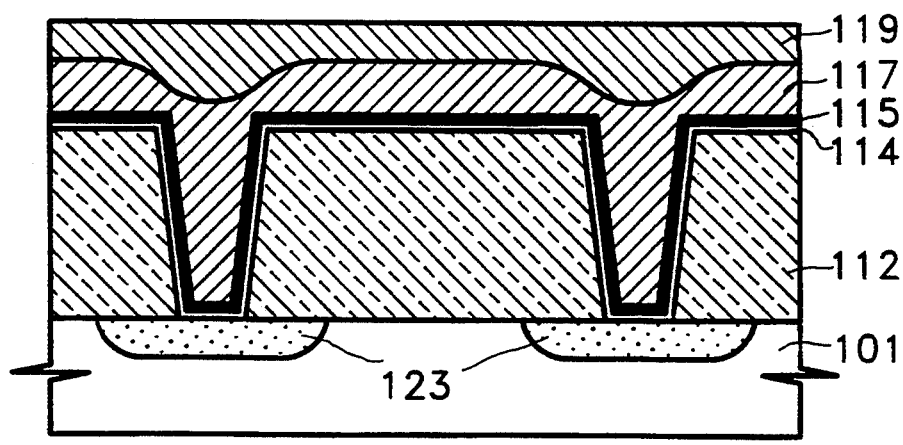

FIGS. 29 to 31 illustrate yet still another embodiment of a method for forming a wiring layer of the present invention.

FIG. 29 illustrates a step of forming a first conductive layer consisting of a refractory first metal layer 115 and a metal layer 116. More particularly, an insulating layer 112 having an opening 113(a tapered contact hole over an impurity-doped region 123 of the semiconductor substrate) is formed on a semiconductor substrate 111 and, then a diffusion barrier layer 114 is formed in the same manner as embodiment 1.

Thereafter, a refractory metal layer 115 is formed by a sputtering method or CVD method. As a refractory metal used in this embodiment, Ti, Mo, W, Ta, etc. may be mentioned. Refractory metal layer 115 has a thickness below 500 Å, and preferably, 100–300 Å.

Then, first metal layer 116 is formed on refractory metal layer 115 by depositing a metal having a Si component such as an Al—Si alloy (Al-1% Si alloy), an Al—Cu—Si alloy (Al-0.5% Cu-1% Si alloy), etc. in the same manner as in embodiment 1.

First metal layer 116 has a thickness of about 10–80%, preferably about one third to two-thirds of the desired thickness of the wiring layer. In this embodiment, the thickness of first metal layer 116 is about 4,000 Å and the thickness of the wiring layer is 6,000 Å. It is preferable that the first metal layer is more than twice as thick as the refractory metal layer, for easily forming a refractory metal silicide.

FIG. 30 illustrates a step of filling up opening with the material of the first conductive layer by heat-treating. The heat-treating step is carried out in the same manner as in embodiment 1.

During this heat-treating step, the refractory metal atoms of refractory metal layer 115 react with the aluminum atoms of a first metal layer 116 to form a refractory metal aluminide on the inter-surface between refractory metal layer 115, and first metal layer 116, thereby preventing Si precipitate formation. Additionally, first metal layer 116 flows into the opening 113 to completely fill it. The above-resulted refractory metal aluminide is absorbed into the first metal layer 116 to increase the solid solubility of Si in a refractory metal-aluminum system, and thus barrier layer 114 is preferably formed in the same manner as in embodiment 4.

Here, reference numeral 117 represents the first metal layer after the heat-treatment step which completely fills opening. Then, a second conductive layer is formed and heat-treated in the same manner as in embodiment 2.

In this embodiment, the second conductive layer may be formed by depositing not only a metal having no Si component but also a metal having a Si component. In a previous heat-treating step of a first conductive layer, first metal layer 116 has absorbed the refractory metal atoms from refractory metal layer 115. It is known that an Al—Ti—Si alloy may contain up to 15–20 percent by weight of silicon at 450° C. Thus, if the Al—Si alloy absorbs Ti atoms to form an Al—Ti—Si alloy, the Si solubility is increased. Therefore, for forming a second conductive layer although, a metal having a Si component is deposited, the reliability of a wiring layer does not deteriorate, since first metal layer 116 absorbs Si atoms from the second conductive layer during a heat-treatment step of the second conductive layer.

FIG. 31 illustrates the second conductive layer after the heat-treating step of the second conductive layer, the surface of which is planarized to consequently give a planarized wiring layer. Here, reference numeral 119 represents the heat-treated second conductive layer.

The subsequent steps for completing a wiring layer as shown in FIG. 11 are carried out in the same manner as in embodiment 2.

Tests concerning Leakage current, Si precipitate formation and the relative filling of the contact holes have bee carried out on wiring layers formed in accordance with the above embodiments 1 through 5. Equivalent tests have been conducted respectively for the method described in U.S. patent application Ser. No. 07/828,458 and C. S. Park's process. Each of these tests was performed on ten thousand 0.7 μm-by-0.8 μm contact holes.

TABLE 1

| | Si precipitate formation | leakage current | contact hole filling |
|---|---|---|---|
| Embodiment 1 | not present | $\leq 10^{-10}$ A | 100% |

TABLE 1-continued

| | Si precipitate formation | leakage current | contact hole filling |
|---|---|---|---|
| Embodiment 2 | not present | $\leq 10^{-10}$ A | 100% |
| Embodiment 3 | not present | $\leq 10^{-10}$ A | 100% |
| Embodiment 4 | not present | $\leq 10^{-10}$ A | 100% |
| Embodiment 5 | not present | $\leq 10^{-10}$ A | 100% |
| Prior method (US 07/828,458) | not present | $> 10^{-9}$ A | 100%* |
| Prior method (C.S. Park's process) | present | $\leq 10^{-10}$ A | 70% |

*after two heat-treating steps

As can be seen from the above, providing a first conductive layer as in the present invention prevented the formation of a Si precipitate after heat-treating the first conductive layer according to C. S. Park's process, when the temperature is lowered during an etching step for forming a wiring pattern. Although a Si precipitate is formed on a grain boundary, the conductive layer according to the present invention readily absorbs it. The Si atoms diffuse from a silicon-rich layer into the metal layer whose Si concentration is low. Therefore, formation of a Si precipitate is absolutely prevented. Further, the leakage current due to a fine Al spiking does not occur while the contact hole or opening (size: $<1$ μm; aspect ratio: $>1.0$) is completely filled with a conductive material.

It will be apparent that many modifications and variations could be effected easily by one skilled in the art without departing from the spirit or scope of the novel concepts of the present invention.

What is claimed is:

1. A semiconductor device including a wiring layer, comprising:
   a semiconductor substrate;
   an insulating layer formed on said semiconductor substrate, said insulating layer having an opening exposing a portion of a surface underlying said insulating layer;
   a first conductive layer formed on said insulating layer and completely filling said opening, said first conductive layer being comprised of a first metal layer formed on an inner surface of said opening, on said insulating layer, and on said exposed portion of said underlying surface and a second metal layer formed on said first metal layer, said first metal layer being comprised of a material having a Si component and selected from a group consisting of an Al—Si alloy and an Al—Cu—Si alloy and said second metal layer being comprised of a material having no Si component and selected from a group consisting of pure aluminum, an Al—Cu alloy and an Al—Ti alloy, wherein said first conductive layer does not produce Si precipitates when subjected to cooling following heat treatment for completely filling said opening with said first conductive layer;
   a second conductive layer having a planarized surface; and,
   wherein said first conductive layer and said second conductive layer together comprise said wiring layer.

2. The semiconductor device as set forth in claim 1, further comprising a diffusion barrier layer formed on said insulating layer, said inner surface of said hole and said underlying surface.

3. The semiconductor device as set forth in claim 2, wherein said diffusion barrier layer is comprised of a material selected from a group consisting of transition metals and transition metal compounds.

4. The semiconductor device as set forth in claim 1, further comprising a diffusion barrier layer formed on said insulating layer, said inner surface of said hole and said underlying surface.

5. A semiconductor device including a wiring layer, comprising:
   a semiconductor substrate;
   an insulating layer formed on said semiconductor substrate, said insulating layer having an opening exposing a portion of a surface underlying said insulating layer;
   a first conductive layer formed on said insulating layer and completely filling said opening, said first conductive layer being comprised of a first metal layer formed on an inner surface of said opening, on said insulating layer, and on said exposed portion of said underlying surface, and a second metal layer formed on said first metal layer, said first metal layer being comprised of a material having a Si component and a second metal layer formed on said first metal layer, and said second metal layer being comprised of a material having no Si component, wherein said first conductive layer does not produce Si precipitates when subjected to cooling following heat treatment for completely filling said opening with said first conductive layer;
   a second conductive layer having a planarized surface; and,
   wherein said first conductive layer and said second conductive layer together comprise said wiring layer, and said first conductive layer has a thickness of about one-third to two-thirds of a predetermined thickness of said wiring layer.

6. The semiconductor device as set forth in claim 5, further comprising a diffusion barrier layer formed on said insulating layer, said inner surface of said hole and said underlying surface.

7. A semiconductor device including a wiring layer, comprising:
   a semiconductor substrate;
   an insulating layer formed on said semiconductor substrate, said insulating layer having an opening exposing a portion of a surface underlying said insulating layer;
   a first conductive layer formed on said insulating layer and completely filling said opening, said first conductive layer being comprised of a first metal layer formed on an inner surface of said opening, on said insulating layer, and on said exposed portion of said underlying surface, and a second metal layer formed on said first metal layer, said first metal layer being comprised of a material having a Si component and said second metal layer being comprised of a material having no Si component, wherein said first conductive layer does not produce Si precipitates when subjected to cooling following heat treatment for completely filling said opening with said first conductive layer;
   a second conductive layer having a planarized surface; and,
   wherein said first conductive layer and said second conductive layer together comprise said wiring layer; and,
   wherein said first metal layer has a thickness not more than one-quarter of a predetermined thickness of said wiring layer, and said second metal layer has a thickness not less than five-twelfths of said predetermined thickness of said wiring layer.

8. The semiconductor device as set forth in claim 7, further comprising a diffusion barrier layer formed on said insulating layer, said inner surface of said hole and said underlying surface.

9. A semiconductor device including a wiring layer, comprising:
a semiconductor substrate;
an insulating layer formed on said semiconductor substrate, said insulating layer having an opening exposing a portion of a surface underlying said insulating layer;
a first conductive layer formed on said insulating layer and completely filling said opening, said first conductive layer being comprised of a first metal layer formed on an inner surface of said opening, on said insulating layer, and on said exposed portion of said underlying surface, and a second metal layer formed on said first metal layer, said first metal layer being comprised of a refractory metal silicide material and said second metal layer being comprised of a metal selected from a group consisting of metal having no Si component and a metal having not more than 0.5% by weight of a Si component, wherein said first conductive layer does not produce Si precipitates when subjected to cooling following heat treatment for completely filling said opening with said first conductive layer;
a second conductive layer having a planarized surface; and,
wherein said first conductive layer and said second conductive layer together comprise said wiring layer.

10. The semiconductor device as set forth in claim 9, wherein said first metal layer has a thickness of about 200–1,000 angstroms.

11. The semiconductor device as set forth in claim 9, wherein said refractory metal silicide material selected from a group consisting of $WSi_2$, $MoSi_2$, $TiSi_2$, and $TaSi_2$.

12. The semiconductor device as set forth in claim 9, wherein said second metal layer is comprised of a metal selected from a group consisting of pure aluminum, an Al—Cu alloy, an Al—Ti alloy, and an aluminum alloy having not more than 0.5% by weight of a Si component.

13. The semiconductor device as set forth in claim 9, wherein said second metal layer has a thickness of one-third to two-thirds a predetermined thickness of said wiring layer.

14. The semiconductor device as set forth in claim 9, further comprising a diffusion barrier layer formed on said insulating layer, said inner surface of said hole and said underlying surface.

15. A semiconductor device including a wiring layer, comprising:
a semiconductor substrate;
an insulating layer formed on said semiconductor substrate, said insulating layer having an opening exposing a portion of a surface underlying said insulating layer;
a first conductive layer formed on said insulating layer and completely filling said opening, said first conductive layer being comprised of a first metal layer formed on an inner surface of said opening, on said insulating layer, and on said exposed portion of said underlying surface, and a second metal layer formed on said first metal layer, said first metal layer being comprised of a refractory metal material and said second metal layer being comprised of a metal having a Si component, wherein said first conductive layer does not produce Si precipitates when subjected to cooling following heat treatment for completely filling said opening with said first conductive layer;
a second conductive layer having a planarized surface; and,
wherein said first conductive layer and said second conductive layer together comprise said wiring layer.

16. The semiconductor device as set forth in claim 15, wherein said refractory metal material is comprised of a metal selected from a group consisting of Ti, Mo, W and Ta.

17. The semiconductor device as set forth in claim 15, wherein said first metal layer has a thickness of below 500 angstroms.

18. The semiconductor device as set forth in claim 16, wherein said refractory metal material has a thickness of about 100–300 angstroms.

19. The semiconductor device as set forth in claim 15, wherein said second metal layer has a thickness of about 10–80% of a predetermined thickness of said wiring layer.

20. The semiconductor device as set forth in claim 15, wherein said second metal layer is comprised of a metal selected from a group consisting of an Al—Si alloy and an Al—Cu—Si alloy.

21. The semiconductor device as set forth in claim 20, further comprising an anti-reflective layer formed on said second conductive layer.

22. The semiconductor device as set forth in claim 21, wherein said anti-reflective layer is comprised of a transition metal compound.

23. The semiconductor device as set forth in claim 15, further comprising a diffusion barrier layer formed on said insulating layer, said inner surface of said hole and said underlying surface.

24. A semiconductor device including a wiring layer, comprising:
a semiconductor substrate;
an insulating layer formed on said semiconductor substrate, said insulating layer having an opening exposing a portion of a surface underlying said insulating layer;
a first conductive layer formed on said insulating layer and completely filling said opening, said first conductive layer being comprised of a first metal layer formed on an inner surface of said opening, on said insulating layer, and on said exposed portion of said underlying surface, and a second metal layer formed on said first metal layer, said second metal layer being comprised of a metal having no Si component and selected from a group consisting of pure aluminum, an Al—Cu alloy and an Al—Ti alloy, wherein said first conductive layer does not produce Si precipitates when subjected to cooling following heat treatment for completely filling said opening with said first conductive layer;
a second conductive layer having a planarized surface; and,
wherein said first conductive layer and said second conductive layer together comprise said wiring layer.

25. The semiconductor device as set forth in claim 24, wherein said second conductive layer has a thickness of about one-third to two-thirds of a predetermined thickness of said wiring layer.

26. The semiconductor device as set forth in claim 24, further comprising a diffusion barrier layer formed on said insulating layer, said inner surface of said hole and said underlying surface.

27. A semiconductor device including a wiring layer, comprising:
 a semiconductor substrate;
 an insulating layer formed on said semiconductor substrate, said insulating layer having an opening exposing a portion of a surface underlying said insulating layer;
 a first conductive layer formed on said insulating layer and completely filling said opening, said first conductive layer being comprised of a first metal layer formed on an inner surface of said opening, on said insulating layer, and on said exposed portion of said underlying surface, and a second metal layer formed on said first metal layer, wherein said first conductive layer does not produce Si precipitates when subjected to cooling following heat treatment for completely filling said opening with said first conductive layer;
 a second conductive layer having a planarized surface; and,
 wherein said first conductive layer and said second conductive layer together comprise said wiring layer; and,
 wherein said opening comprises a contact hole with a step formed thereon.

28. The semiconductor device as set forth in claim 27, further comprising a diffusion barrier layer formed on said insulating layer, said inner surface of said hole and said underlying surface.

29. A semiconductor device including a wiring layer, comprising:
 a semiconductor substrate;
 an insulating layer formed on said semiconductor substrate, said insulating layer having an opening exposing a portion of a surface underlying said insulating layer;
 a first conductive layer formed on said insulating layer and completely filling said opening, said first conductive layer being comprised of a first metal layer formed on an inner surface of said opening, on said insulating layer, and on said exposed portion of said underlying surface, and a second metal layer formed on said first metal layer, wherein said first conductive layer does not produce Si precipitates when subjected to cooling following heat treatment for completely filling said opening with said first conductive layer;
 a second conductive layer having a planarized surface; and,
 wherein said first conductive layer and said second conductive layer together comprise said wiring layer; and,
 wherein said opening comprises a tapered contact hole.

30. The semiconductor device as set forth in claim 29, further comprising a diffusion barrier layer formed on said insulating layer, said inner surface of said hole and said underlying surface.

31. A semiconductor device including a wiring layer comprising:
 a semiconductor substrate having an impurity-doped region;
 an insulating layer having a contact hole formed on said impurity-doped region of said semiconductor substrate, said contact hole having an aspect ratio grater than 1.0;
 a first conductive layer comprised of a refractory metal silicide layer formed on an inner surface of said contact hole, on a surface of said insulating layer and on an exposed surface of said semiconductor substrate, a metal layer having no Si component formed on said refractory metal layer, and said metal layer completely filling said contact hole; and
 a second conductive layer having a planarized surface formed on said first conductive layer and being comprised of a metal having no Si component.

32. A semiconductor device including a wiring layer comprising:
 a semiconductor substrate having an impurity-doped region;
 an insulating layer having a contact hole formed on said impurity-doped region of said semiconductor substrate, said contact hole having an aspect ratio greater than 1.0;
 a first conductive layer comprised of a refractory metal layer formed on an inner surface of said contact hole, on a surface of said insulating layer and on an exposed surface of said semiconductor substrate and a metal layer having a Si component, formed on said refractory metal layer and completely filling said contact hole; and
 a second conductive layer having a planarized surface formed on said first conductive layer and being comprised of a metal having no Si component.

* * * * *